(12) United States Patent
Hayashi et al.

(10) Patent No.: US 12,349,327 B2
(45) Date of Patent: Jul. 1, 2025

(54) MODULE

(71) Applicant: Murata Manufacturing Co., Ltd., Nagaokakyo (JP)

(72) Inventors: Shota Hayashi, Nagaokakyo (JP); Nobuaki Ogawa, Nagaokakyo (JP); Yuki Asano, Nagaokakyo (JP); Akihiro Muranaka, Nagaokakyo (JP); Takanori Uejima, Nagaokakyo (JP); Hiromichi Kitajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 213 days.

(21) Appl. No.: 18/351,751

(22) Filed: Jul. 13, 2023

(65) Prior Publication Data

US 2023/0371219 A1   Nov. 16, 2023

Related U.S. Application Data

(63) Continuation of application No. PCT/JP2021/048312, filed on Dec. 24, 2021.

(30) Foreign Application Priority Data

Jan. 15, 2021   (JP) .................................. 2021-005113

(51) Int. Cl.
*H05K 9/00* (2006.01)
*H01L 23/552* (2006.01)
(Continued)

(52) U.S. Cl.
CPC ......... *H05K 9/0022* (2013.01); *H01L 23/552* (2013.01); *H01L 25/0655* (2013.01);
(Continued)

(58) Field of Classification Search
CPC ....... H05K 9/0022; H05K 2201/10371; H05K 2201/10522
See application file for complete search history.

(56) References Cited

U.S. PATENT DOCUMENTS 8,897,028 B2\* 11/2014 Takemura ............. H01L 23/552
174/521
2007/0246825 A1\* 10/2007 Oh ........................ H01L 23/552
257/E23.125
(Continued)

FOREIGN PATENT DOCUMENTS

JP          S58-60998 U      4/1983
JP          S58-180696 U    12/1983
(Continued)

OTHER PUBLICATIONS

International Search Report for PCT/JP2021/048312 dated Mar. 8, 2022.

*Primary Examiner* — Sherman Ng
(74) *Attorney, Agent, or Firm* — McDonald Hopkins LLC

(57) ABSTRACT

A module includes a substrate and a first metal member. The substrate has an upper main surface and a lower main surface arranged in an up-down direction. The first metal member includes a first plate-shaped portion provided on the upper main surface of the substrate, and includes a front main surface and a back main surface arranged in a front-back direction when viewed in an up-down direction. The first metal member further includes a first left support portion. A boundary between the first plate-shaped portion and the first left support portion is defined as a first left boundary. The first left support portion bends with respect to the first plate-shaped portion at the first left boundary so as to be located behind the first plate-shaped portion.

20 Claims, 30 Drawing Sheets

(51) Int. Cl.
*H01L 25/065* (2023.01)
*H01L 25/16* (2023.01)
*H05K 1/02* (2006.01)
*H05K 1/18* (2006.01)

(52) U.S. Cl.
CPC ............ H01L 25/16 (2013.01); H05K 1/023 (2013.01); H05K 1/181 (2013.01); *H05K 2201/10015* (2013.01); *H05K 2201/10022* (2013.01); *H05K 2201/1003* (2013.01); *H05K 2201/10371* (2013.01); *H05K 2201/10522* (2013.01)

(56) References Cited

U.S. PATENT DOCUMENTS

| | | | |
|---|---|---|---|
| 2011/0304993 | A1 | 12/2011 | Takemura |
| 2012/0008288 | A1* | 1/2012 | Tsukamoto .......... H05K 9/0037 361/736 |
| 2019/0393162 | A1* | 12/2019 | Jun .................... H01L 23/3121 |
| 2020/0323077 | A1* | 10/2020 | Han .................... H05K 3/4007 |
| 2022/0007499 | A1 | 1/2022 | Okamoto et al. |

FOREIGN PATENT DOCUMENTS

| | | |
|---|---|---|
| JP | S61-49495 U | 4/1986 |
| JP | H07-183683 A | 7/1995 |
| JP | 2007-294965 A | 11/2007 |
| JP | 2011-258885 A | 12/2011 |
| JP | 2011-258886 A | 12/2011 |
| WO | 2020/202841 A1 | 10/2020 |

* cited by examiner

MODULE

CROSS REFERENCE TO RELATED APPLICATION

This is a continuation of International Application No. PCT/JP2021/048312 filed on Dec. 24, 2021 which claims priority from Japanese Patent Application No. 2021-005113 filed on Jan. 15, 2021. The contents of these applications are incorporated herein by reference in their entireties.

BACKGROUND OF THE DISCLOSURE

Field of the Disclosure

The present disclosure relates to a module including a substrate on which an electronic component is mounted.

Description of the Related Art

As a disclosure related to the module according to the related art, for example, a circuit module described in Patent Literature 1 is known. The circuit module includes a circuit board, a plurality of electronic components, a conductive partition, and an insulating resin layer.

The circuit board has a plate shape having an upper main surface. The conductive partition is provided on the upper main surface of the circuit board. The conductive partition is one metal plate extending in an upward direction from the upper main surface of the circuit board. The conductive partition includes a first component, a second component, and a third component. The first component and the second component extend in the left-right direction when viewed in the up-down direction. The first component is provided on the right front of the second component. The front end of the third component is connected to the left end of the first component. The back end of the third component is connected to the right end of the second component. As described above, the conductive partition has a structure in which one metal plate is bent at two points of the boundary between the first component and the third component and the boundary between the second component and the third component. Thus, the conductive partition divides the space on the circuit board into a first block and a second block. The first block is the space before the conductive partition. The second block is the space after the conductive partition.

Some of the plurality of electronic components are provided in the first block. The rest of the plurality of electronic components are provided in the second block. The insulating resin layer covers the plurality of electronic components and the conductive partition. In such a circuit module described in Patent Literature 1, electromagnetic interference between some of the plurality of electronic components and the rest of the plurality of electronic components is suppressed by the conductive partition.

[Patent Literature 1]

Japanese Patent Unexamined Publication No. 2011-258886 bulletin

BRIEF SUMMARY OF THE DISCLOSURE

By the way, in the circuit module described in Patent Literature 1, there is a demand for widening a region where an electronic component can be mounted.

Therefore, a possible benefit of the present disclosure is to provide a module capable of widening a region where an electronic component can be mounted.

A module according to an embodiment of the present disclosure includes: a substrate having an upper main surface and a lower main surface arranged in an up-down direction; a first metal member including a first plate-shaped portion provided on the upper main surface of the substrate, the first plate-shaped portion having a front main surface and a back main surface arranged in a front-back direction when viewed in an up-down direction; a first electronic component mounted on the upper main surface of the substrate and disposed in front of the first metal member; a second electronic component mounted on the upper main surface of the substrate and disposed behind the first metal member; and a sealing resin layer provided on the upper main surface of the substrate and covering the first metal member, the first electronic component, and the second electronic component. The first metal member further includes a first left support portion. A boundary between the first plate-shaped portion and the first left support portion is defined as a first left boundary. The first left boundary is located on a left part of the first metal member. The first left support portion is bent with respect to the first plate-shaped portion at the first left boundary so as to be located in front of or behind the first plate-shaped portion. A lower end of the first plate-shaped portion and a lower end of the first left support portion are fixed to the substrate. A first left lower notch extending in an upward direction from a lower end of the first plate-shaped portion and a lower end of the first left support portion is provided such that a lower end of the first left boundary is located above a lower end of the first plate-shaped portion and a lower end of the first left support portion.

A module according to the present disclosure can widen a region where an electronic component can be mounted.

BRIEF DESCRIPTION OF THE SEVERAL VIEWS OF THE DRAWINGS

FIG. 6 is a top view of the first metal member 14 and a mounting electrode 12a.

FIG. 7 is a cross-sectional view of the first metal member 14 and the mounting electrode 12a.

FIG. 13 is a top view of a first metal member 14a.

FIG. 18 is a top view of the first metal member 14, the mounting electrode 12a, and a solder 122 of a module 10a.

DETAILED DESCRIPTION OF THE DISCLOSURE

Embodiments

[Structure of Module]

Figure 1:
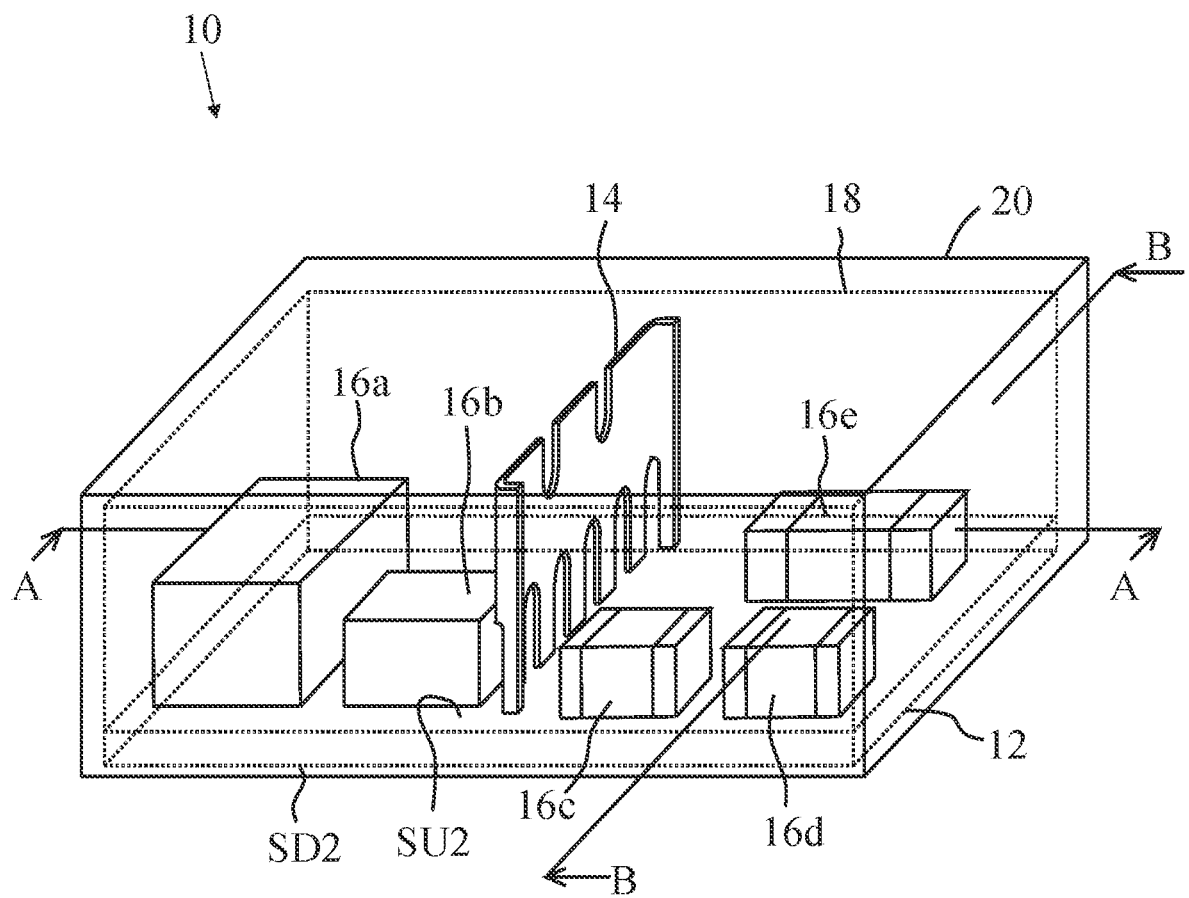
FIG. 1 is a perspective view of a module 10.
Figure 1:
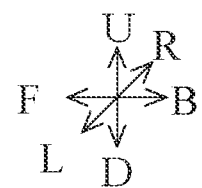
Figure 2:
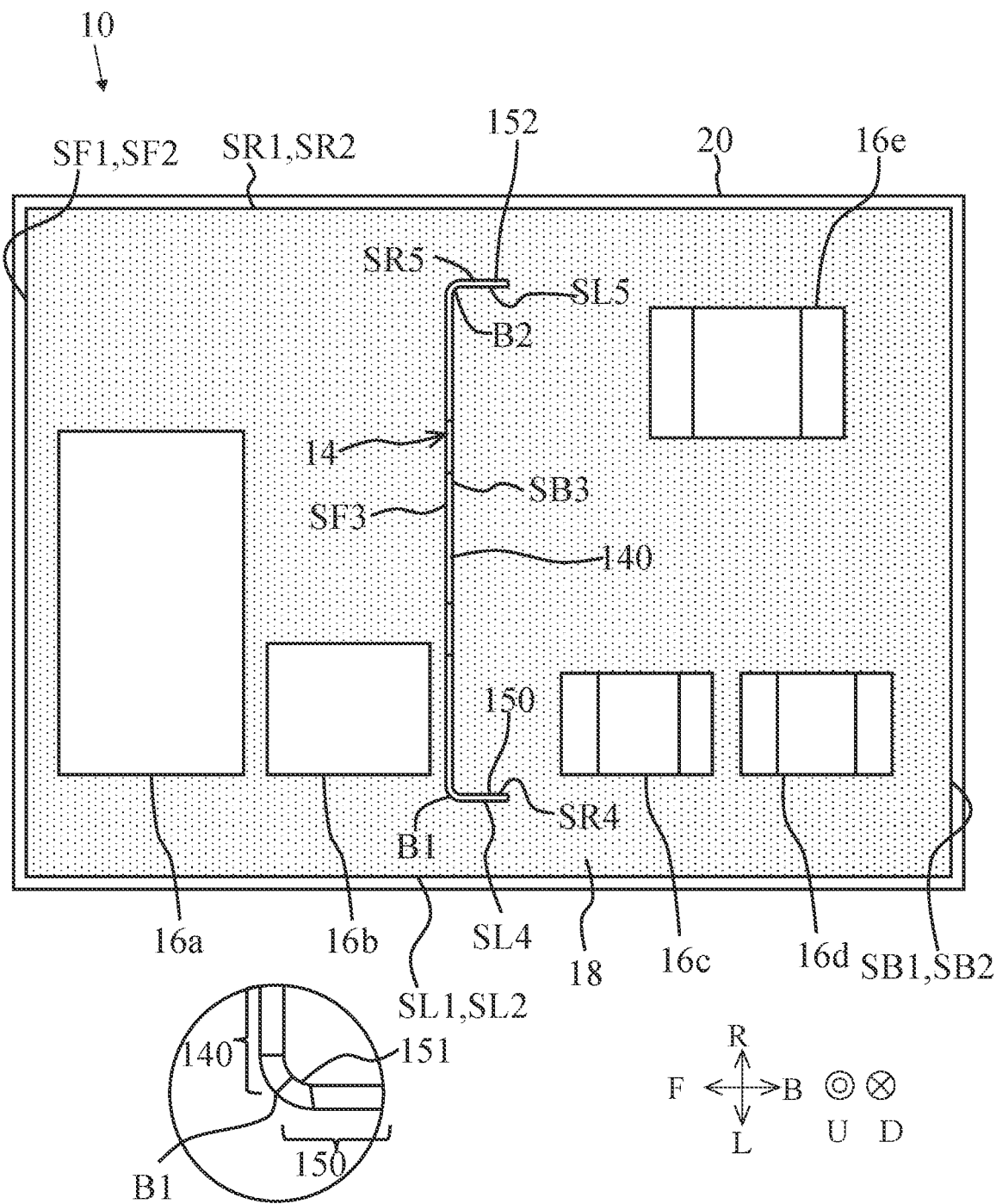
FIG. 2 is a top view of the module 10.
Figure 3:
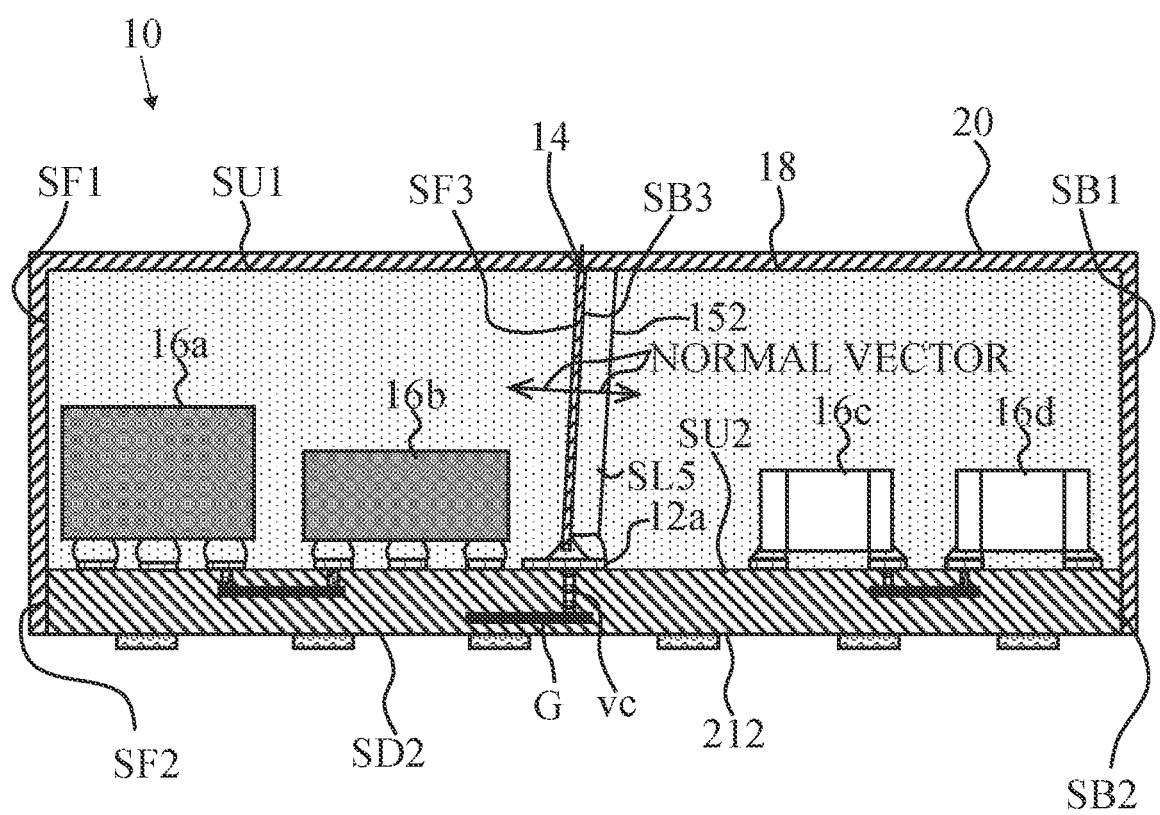
FIG. 3 is a cross-sectional view of the module 10 taken along line A-A.
Figure 3:
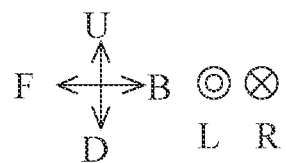
Figure 4:
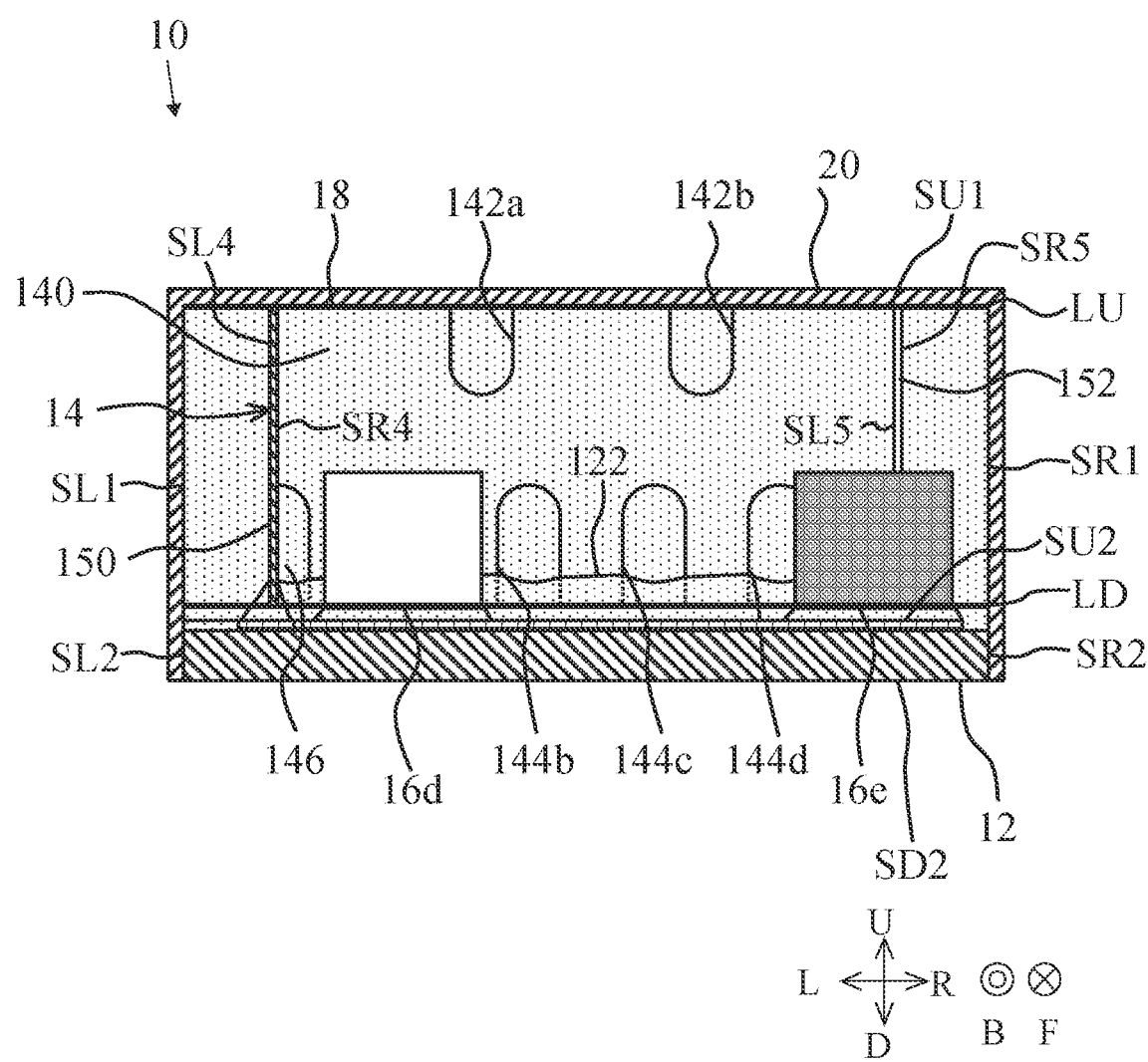
FIG. 4 is a cross-sectional view of the module 10 taken along line B-B.
Figure 5:
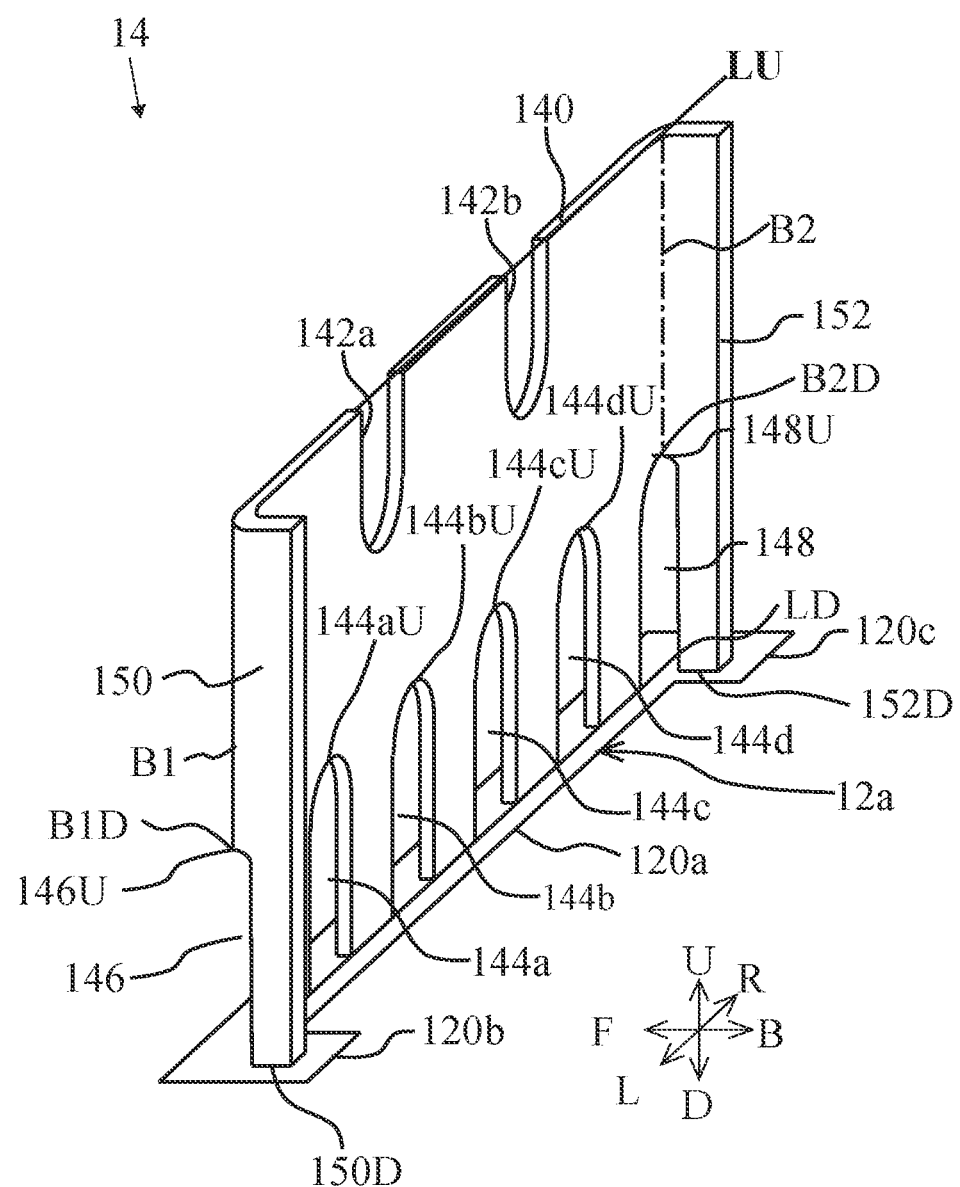
FIG. 5 is a perspective view of a first metal member 14.
Figure 6:
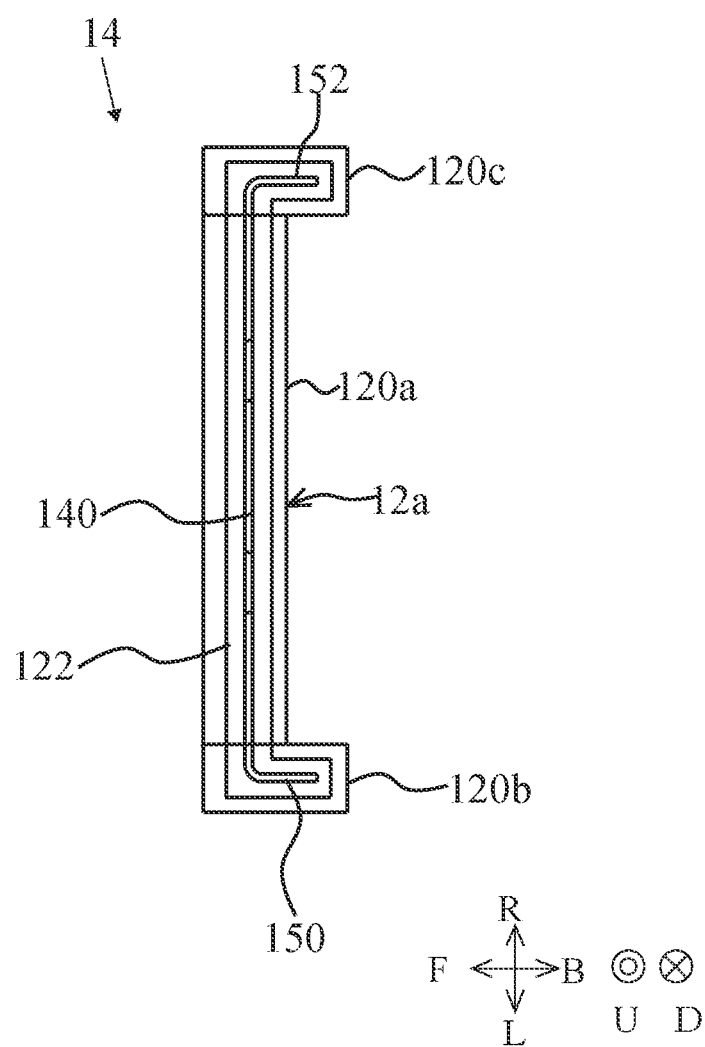
Figure 7:
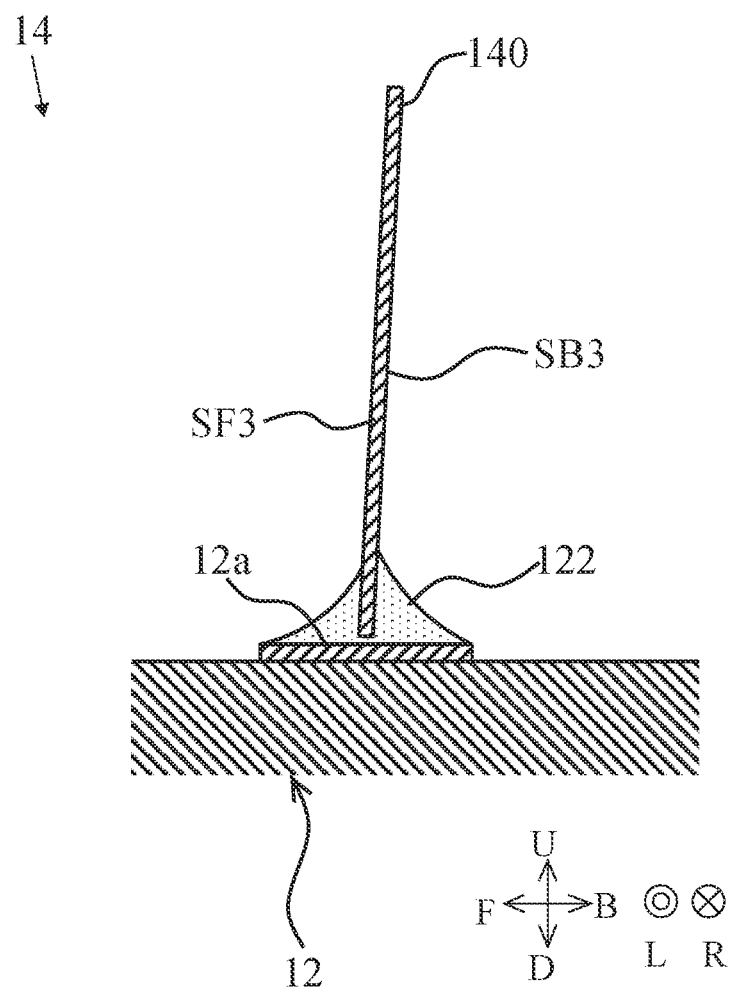
Figure 8:
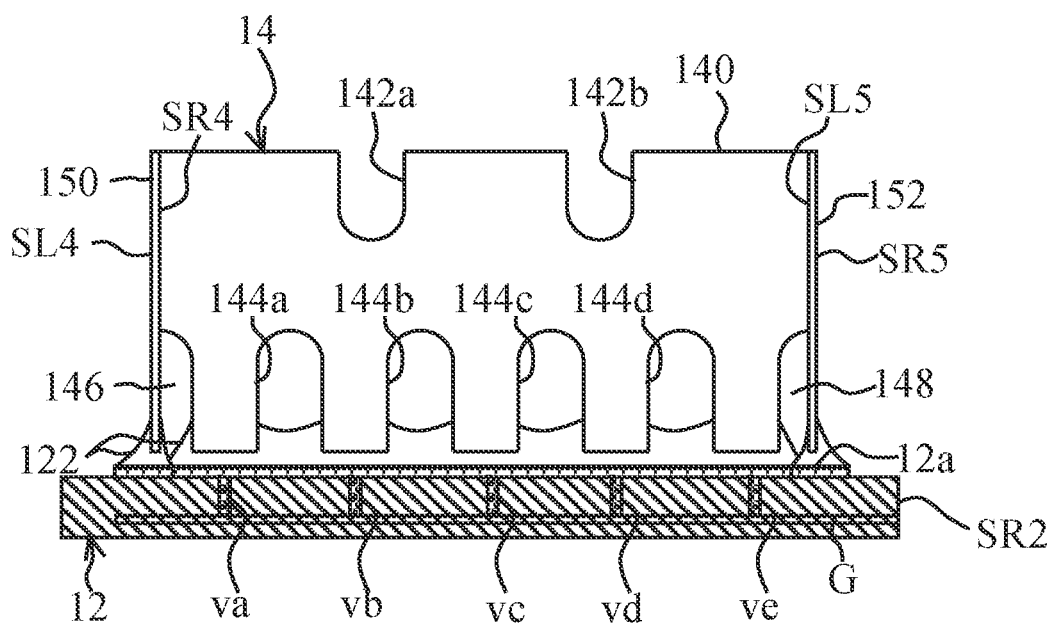
FIG. 8 is a view combining a rear view of the first metal member 14 and a cross-sectional view of the substrate 12.
Figure 8:
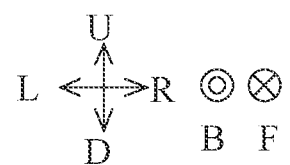

Hereinafter, a structure of a module 10 according to an embodiment of the present disclosure will be described with reference to the drawings. FIG. 1 is a perspective view of the module 10. In FIG. 1, the inside of the module 10 is seen through. FIG. 2 is a top view of the module 10. In FIG. 2, the inside of the module 10 is seen through. FIG. 3 is a cross-sectional view of the module 10 taken along line A-A. FIG. 4 is a cross-sectional view of the module 10 taken along line B-B. FIG. 5 is a perspective view of a first metal member 14. FIG. 6 is a top view of the first metal member 14 and a mounting electrode 12a. FIG. 7 is a cross-sectional view of the first metal member 14 and the mounting electrode 12a. FIG. 8 is a view combining a rear view of the first metal member 14 and a cross-sectional view of a substrate 12.

Hereinafter, the direction in the module 10 will be described. As illustrated in FIG. 1, the substrate 12 of the module 10 has a plate shape. Therefore, the direction in which an upper main surface SU2 and a lower main surface SD2 of the substrate 12 are arranged is defined as an up-down direction. As illustrated in FIG. 2, when viewed in the up-down direction, a direction in which a front main surface SF3 and a back main surface SB3 of a first plate-shaped portion 140 of the first metal member 14 are arranged is defined as a front-back direction. In addition, a direction orthogonal to the front-back direction and the up-down direction is defined as a left-right direction. The up-down direction, the left-right direction, and the front-back direction are orthogonal to each other. However, the up-down direction, the left-right direction, and the front-back direction may not coincide with the up-down direction, the left-right direction, and the front-back direction in actual use of the module 10. In each drawing, the upward direction and the downward direction may be exchanged, the left direction and the right direction may be exchanged, or the forward direction and the backward direction may be exchanged.

Hereinafter, definitions of terms in the present specification will be described. First, a positional relationship of members in the present specification will be defined. X to Z are members or parts constituting the module 10. In the present specification, X and Y arranged in the front-back direction indicate the following states. When X and Y are viewed in a direction perpendicular to the front-back direction, both X and Y are arranged on an arbitrary straight line indicating the front-back direction. In the present specification, X and Y arranged in the front-back direction when viewed in the up-down direction indicate the following states. When X and Y are viewed in the up-down direction, both X and Y are arranged on an arbitrary straight line indicating the front-back direction. In this case, when X and Y are viewed from the left-right direction different from the up-down direction, one of X and Y may not be arranged on arbitrary straight line indicating the front-back direction. X and Y may be in contact with each other. X and Y may be separated from each other. Z may be present between X and Y. This definition also applies to directions other than the front-back direction.

In the present specification, arranging X before Y refers to the following state. At least a part of X is disposed in a region through which Y passes when Y translates in the forward direction. Therefore, X may be within the region through which Y passes when Y translates in the forward direction, or may protrude from the region through which Y passes when Y translates in the forward direction. In this case, X and Y are aligned in the front-back direction. This definition also applies to directions other than the front-back direction.

In the present specification, arranging X in front of Y refers to the following state. X is disposed in front of a plane passing through the front end of Y and orthogonal to the front-back direction. In this case, X and Y may be arranged in the front-back direction or may not be arranged in the front-back direction. This definition also applies to directions other than the front-back direction.

In the present specification, each part of X is defined as follows unless otherwise specified. The front part of X means the front half of X. The rear part of X means the rear half of X. The left part of X means the left half of X. The right part of X means the right half of X. The upper part of X means the upper half of X. The lower part of X means the lower half of X. The front end of X means an end of X in the forward direction. The back end of X means an end of X in the backward direction. The left end of X means an end of X in the left direction. The right end of X means an end of X in the right direction. The upper end of X means an end of X in the upward direction. The lower end of X means an end of X in the downward direction. The front end portion of X means the front end of X and the vicinity thereof. The back end portion of X means the back end of X and the vicinity thereof. The left end portion of X means the left end of X and the vicinity thereof. The right end portion of X means the right end of X and the vicinity thereof. The upper end portion of X means the upper end of X and the vicinity thereof. The lower end portion of X means the lower end of X and the vicinity thereof.

When any two members in the present specification are defined as X and Y, the relationship between any two members has the following meaning. In the present specification, "X is supported by Y" includes a case where X is attached to Y so as not to be movable with respect to Y (that is, it is fixed) and a case where X is attached to Y so as to be movable with respect to Y. Further, "X is supported by Y" includes both a case where X is directly attached to Y and a case where X is attached to Y via Z.

In the present specification, "X and Y are electrically connected" means that electricity is conducted between X and Y. Therefore, X and Y may be in contact with each other, or X and Y may not be in contact with each other. When X and Y are not in contact with each other, Z having conductivity is disposed between X and Y.

The module 10 is, for example, a high frequency module. The high frequency module is, for example, an analog front end module of a portable wireless communication device. However, the module 10 is not limited to the high frequency module. As illustrated in FIGS. 1 to 4, the module 10 includes the substrate 12, the first metal member 14, electronic components 16a to 16e, a sealing resin layer 18, and a shield 20.

The substrate 12 is, for example, a multilayer wiring substrate having a structure in which a plurality of insulator layers made of a low-temperature co-fired ceramic, a high-temperature co-fired ceramic, glass epoxy, or the like is stacked. The substrate 12 has a plate shape. Therefore, the substrate 12 has the upper main surface SU2, the lower main surface SD2, a left surface SL2, a right surface SR2, a front surface SF2, and a back surface SB2 as illustrated in FIGS. 2 to 4. The substrate 12 has a rectangular shape when viewed in the up-down direction. An electric circuit is provided by a conductor layer and an interlayer connection conductor inside the upper main surface SU2 of the substrate 12, the lower main surface SD2 of the substrate 12, and the substrate 12. However, details of the electric circuit will be described later.

The first metal member 14 is provided on the upper main surface SU2 of the substrate 12. The first metal member 14 has a structure in which one metal plate is subjected to bending. The first metal member 14 is made of, for example, tough pitch copper. Note that brass, phosphor bronze, SUS, aluminum, or the like may be used instead of the tough pitch copper. The thickness of the first metal member 14 is, for example, 50 μm. As illustrated in FIGS. 1, 2, 4, and 5, the first metal member 14 includes the first plate-shaped portion 140, a first left support portion 150, and a first right support portion 152. The first plate-shaped portion 140 has the front main surface SF3 and the back main surface SB3. The front main surface SF3 and the back main surface SB3 are arranged in the front-back direction when viewed in the up-down direction. The first plate-shaped portion 140 is provided on the upper main surface SU2 of the substrate 12. The first plate-shaped portion 140 extends in the upward direction from the upper main surface SU2 of the substrate 12. However, as illustrated in FIG. 3, the first plate-shaped portion 140 is slightly inclined in the backward direction with respect to the up-down direction. That is, the normal vector of the front main surface SF3 of the first plate-shaped portion 140 has a slight component of the upward direction. The normal vector of the back main surface SB3 of the first plate-shaped portion 140 has a slight component of the downward direction.

As illustrated in FIG. 4, the first plate-shaped portion 140 has a rectangular shape when viewed in the front-back direction. However, the first plate-shaped portion 140 is provided with first plate-shaped portion upper notches 142a and 142b and first plate-shaped portion lower notches 144a to 144d. Therefore, strictly speaking, the first plate-shaped portion 140 has a shape different from the rectangular shape when viewed in the front-back direction. Therefore, as illustrated in FIG. 4, when viewed in the front-back direction, a line connecting the upper end of the first plate-shaped portion 140 in the left-right direction is defined as a first plate-shaped portion upper side LU. When viewed in the front-back direction, a line connecting the lower end of the first plate-shaped portion 140 in the left-right direction is defined as a first plate-shaped portion lower side LD. The first plate-shaped portion upper side LU is present at a position farther in the upward direction from the substrate 12 than the first plate-shaped portion lower side LD. In addition, in the present specification, the notch is a recess formed in the outer edge of the first plate-shaped portion 140 by partially missing the first plate-shaped portion 140. The notch in the present specification includes, for example, a U-shaped defect extending from a side of a rectangular plate in a direction orthogonal to an opposite side and an angular U-shaped defect.

The first plate-shaped portion upper notches 142a and 142b extend in the downward direction from the first plate-shaped portion upper side LU. The first plate-shaped portion upper notches 142a and 142b have a U-shape when viewed in the front-back direction. That is, the first plate-shaped portion upper notches 142a and 142b have a shape in which a rectangle having an upper side, a lower side, a left side, and a right side and a semicircle protruding in the downward direction from the lower side of the rectangle are combined. The lower ends of the first plate-shaped portion upper notches 142a and 142b are located above the center of the first plate-shaped portion 140 in the up-down direction when viewed in the front-back direction. The first plate-shaped portion upper notch 142a is located on the left of the first plate-shaped portion upper notch 142b. The lengths in the up-down direction of the first plate-shaped portion upper notches 142a and 142b are, for example, half or less of the length in the up-down direction of the first plate-shaped portion 140. The widths of the first plate-shaped portion upper notches 142a and 142b in the left-right direction are, for example, 150 μm.

The first plate-shaped portion lower notches 144a to 144d extend in the upward direction from the first plate-shaped portion lower side LD. The first plate-shaped portion lower notches 144a to 144d have a vertically inverted U-shape when viewed in the front-back direction. That is, the first plate-shaped portion lower notches 144a to 144d have a shape in which a rectangle and a semicircle protruding in the upward direction from the upper side of the rectangle are combined. The upper ends of the first plate-shaped portion lower notches 144a to 144d are located below the center of the first plate-shaped portion 140 in the up-down direction when viewed in the front-back direction. The first plate-shaped portion lower notches 144a to 144d are arranged in a line in this order from left to right. The first plate-shaped portion lower notches 144a to 144d are arranged at equal intervals in the left-right direction when viewed in the front-back direction. The lengths in the up-down direction of the first plate-shaped portion lower notches 144a to 144d are, for example, half or less of the length in the up-down direction of the first plate-shaped portion 140. The widths of the first plate-shaped portion lower notches 144a to 144d in the left-right direction are, for example, 150 μm.

Here, as illustrated in FIG. 2, a boundary between the first plate-shaped portion 140 and the first left support portion 150 is defined as a first left boundary B1. The first left boundary B1 is located on the left part of the first plate-shaped portion 140. More precisely, the first left boundary B1 is located at the left end of the first plate-shaped portion 140. However, the vicinity of the boundary between the first plate-shaped portion 140 and the first left support portion 150 is curved. Hereinafter, this curved portion is referred to as a curved portion 151. The first left boundary B1 is a portion located at the same distance from each of both ends of the curved portion 151 when viewed in the up-down direction. Note that a portion of the curved portion 151 located to the right of the first left boundary B1 is a part of the first plate-shaped portion 140. A portion of the curved portion 151 located behind the first left boundary B1 is a part of the first left support portion 150.

As illustrated in FIGS. 2 and 5, the first left support portion 150 is connected to the first plate-shaped portion 140 at the first left boundary B1. The first left support portion 150 is bent with respect to the first plate-shaped portion 140 at the first left boundary B1 so as to be located behind the first plate-shaped portion 140. In the present embodiment, the first left support portion 150 extends in the backward direction from the first plate-shaped portion 140 at the first left boundary B1. In the present specification, the state in which the first left support portion 150 extends in the backward direction includes the following two states.

A state in which the first left support portion 150 is parallel to the backward direction.
When viewed in the up-down direction, a state in which the first left support portion 150 forms an angle of 45 degrees or less in the backward direction and the clockwise direction.
When viewed in the up-down direction, a state in which the first left support portion 150 forms an angle of 45 degrees or less in the backward direction and the counterclockwise direction In the present embodiment, the first left support portion 150 is parallel to the backward direction. That is, the first left support portion 150 forms an angle of 90° with the first plate-shaped portion 140. Such a first left support portion 150 is formed by bending the left end portion of the first metal member 14 in the backward direction. However, the first left support portion 150 is not bent at a portion other than the vicinity of the first left boundary B1. Therefore, the first left support portion 150 has a flat plate shape. As illustrated in FIG. 2, the first left support portion 150 includes a left main surface SL4 and a right main surface SR4. The first left support portion 150 has a rectangular shape when viewed in the left-right direction. The position of the upper end of the first left support portion 150 in the up-down direction coincides with the position of the first plate-shaped portion upper side LU of the first plate-shaped portion 140 in the up-down direction. The position of a lower end 150D of the first left support portion 150 in the up-down direction coincides with the position of the first plate-shaped portion lower side LD of the first plate-shaped portion 140 in the up-down direction.

As illustrated in FIG. 5, a first left lower notch 146 is provided in the first plate-shaped portion 140 and the first left support portion 150. More specifically, the first left lower notch 146 extending in the upward direction from the lower end (that is, the first plate-shaped portion lower side LD) of the first plate-shaped portion 140 and the lower end 150D of the first left support portion 150 is provided such that a lower end B1D of the first left boundary B1 is located above the lower end (that is, the first plate-shaped portion lower side LD) of the first plate-shaped portion 140 and the lower end 150D of the first left support portion 150. The first left lower notch 146 has a vertically inverted U-shape. That is, the first left lower notch 146 has a shape in which a rectangle and a semicircle protruding in the upward direction from the upper side of the rectangle are combined.

However, the first left lower notch 146 is formed across the first plate-shaped portion 140 and the first left support portion 150. The first left support portion 150 is bent in the backward direction with respect to the first plate-shaped portion 140. Therefore, when viewed in the front-back direction, a half of the U-shape that is vertically inverted is provided in the first plate-shaped portion 140. When viewed in the left-right direction, the remaining half of the U-shape that is vertically inverted is provided in the first left support portion 150.

The depth of the first left lower notch 146 is equal to the depth of the first plate-shaped portion lower notches 144a to 144d. Therefore, the position of an upper end 146U of the first left lower notch 146 in the up-down direction is the same as the position of upper ends 144aU to 144dU of the first plate-shaped portion lower notches 144a to 144d in the up-down direction.

Here, as illustrated in FIG. 2, a boundary between the first plate-shaped portion 140 and the first right support portion 152 is defined as a first right boundary B2. The first right support portion 152 has a bilaterally symmetrical structure with the first left support portion 150. More specifically, the first right support portion 152 is connected to the first plate-shaped portion 140 at the first right boundary B2. The first right support portion 152 is bent with respect to the first plate-shaped portion 140 at the first right boundary B2 so as to be located behind the first plate-shaped portion 140. In the present embodiment, the first right support portion 152 extends in the backward direction from the first plate-shaped portion 140 at the first right boundary B2.

In the present embodiment, the first right support portion 152 is parallel to the backward direction. That is, the first right support portion 152 forms an angle of 90° with the first plate-shaped portion 140. Such a first right support portion 152 is formed by bending the right end portion of the first metal member 14 in the backward direction. However, the first right support portion 152 is not bent at a portion other than the vicinity of the first right boundary B2. Therefore, the first right support portion 152 has a flat plate shape. As illustrated in FIG. 2, the first right support portion 152 includes a left main surface SL5 and a right main surface SR5. The first right support portion 152 has a rectangular shape when viewed in the left-right direction. The position of the upper end of the first right support portion 152 in the up-down direction coincides with the position of the first plate-shaped portion upper side LU of the first plate-shaped portion 140 in the up-down direction. The position of a lower end 152D of the first right support portion 152 in the up-down direction coincides with the position of the first plate-shaped portion lower side LD of the first plate-shaped portion 140 in the up-down direction.

A first right lower notch 148 is provided in the first plate-shaped portion 140 and the first right support portion 152. More specifically, as illustrated in FIG. 5, the first right lower notch 148 extending in the upward direction from the lower end (that is, the first plate-shaped portion lower side LD) of the first plate-shaped portion 140 and the lower end 152D of the first right support portion 152 is provided such that a lower end B2D of the first right boundary B2 is located above the lower end (that is, the first plate-shaped portion lower side LD) of the first plate-shaped portion 140 and the lower end 152D of the first right support portion 152. The first right lower notch 148 has a vertically inverted U-shape. That is, the first right lower notch 148 have a shape in which a rectangle and a semicircle protruding in the upward direction from the upper side of the rectangle are combined.

However, the first right lower notch 148 is formed across the first plate-shaped portion 140 and the first right support portion 152. The first right support portion 152 is bent in the backward direction with respect to the first plate-shaped portion 140. Therefore, when viewed in the front-back direction, a half of the U-shape that is vertically inverted is provided in the first plate-shaped portion 140. When viewed in the left-right direction, the remaining half of the U-shape that is vertically inverted is provided in the first right support portion 152.

The depth of the first right lower notch 148 is equal to the depth of the first plate-shaped portion lower notches 144a to 144d. Therefore, the position of an upper end 148U of the first right lower notch 148 in the up-down direction is the same as the position of the upper ends 144aU to 144dU of the first plate-shaped portion lower notches 144a to 144d in the up-down direction.

The first metal member 14 configured as described above is fixed to the substrate 12. Hereinafter, fixing of the first metal member 14 to the substrate 12 will be described. As illustrated in FIGS. 3 and 5, the substrate 12 includes the mounting electrode 12a. The mounting electrode 12a is provided on the upper main surface SU2 of the substrate 12. As illustrated in FIG. 6, the mounting electrode 12a includes a mounting electrode main portion 120a, a mounting electrode left end portion 120b, and a mounting electrode right end portion 120c. The mounting electrode main portion 120a has a rectangular shape having long sides extending in the left-right direction when viewed in the up-down direction. The mounting electrode left end portion 120b is connected to the left end of the mounting electrode main portion 120a. The mounting electrode left end portion 120b extends in the backward direction from the left end of the mounting electrode main portion 120a. The mounting electrode right end portion 120c is connected to the right end of the mounting electrode main portion 120a. The mounting electrode right end portion 120c extends in the backward direction from the right end of the mounting electrode main portion 120a.

As illustrated in FIG. 6, a solder 122 is applied to the upper surface of the mounting electrode 12a. The solder 122 overlaps the entire first metal member 14 when viewed in the up-down direction. More precisely, the solder 122 overlaps the entire lower end of the first metal member 14 when viewed in the up-down direction. The lower end of the first plate-shaped portion 140 is fixed to the mounting electrode main portion 120a by the solder 122. Specifically, as illustrated in FIG. 7, the solder 122 is wetted on the front main surface SF3 and the back main surface SB3 at the lower end portion of the first plate-shaped portion 140. The lower end of the first left support portion 150 is fixed to the mounting electrode left end portion 120b by the solder 122. Specifically, as illustrated in FIG. 8, the solder 122 is wetted on the left main surface SL4 and the right main surface SR4 at the lower end portion of the first left support portion 150. The lower end of the first right support portion 152 is fixed to the mounting electrode right end portion 120c by the solder 122. Specifically, as illustrated in FIG. 8, the solder 122 is wetted on the left main surface SL5 and the right main surface SR5 at the lower end portion of the first right support portion 152. Thus, the lower end of the first plate-shaped portion 140, the lower end of the first left support portion 150, and the lower end of the first right support portion 152 are fixed to the substrate 12.

As illustrated in FIG. 8, the substrate 12 further includes interlayer connection conductors va to ve and a ground conductor layer G. The ground conductor layer G is provided inside the substrate 12. The ground conductor layer G is exposed from the right surface SR2 of the substrate 12.

The interlayer connection conductors va to ve electrically connect the mounting electrode 12a and the ground conductor layer G. The interlayer connection conductors va to ve are arranged in a line in this order from left to right below the first metal member 14 as viewed in the front-back direction. The interlayer connection conductors va to ve are arranged at equal intervals under the first metal member 14. The interval between the adjacent interlayer connection conductors va to ve is, for example, ¼ of the wavelength of the high frequency signal transmitted through the signal conductor layer (not illustrated) of the substrate 12.

The interlayer connection conductor va is located between the first left lower notch 146 and the first plate-shaped portion lower notch 144a in the left-right direction. The interlayer connection conductor vb is located between the first plate-shaped portion lower notch 144a and the first plate-shaped portion lower notch 144b in the left-right direction. The interlayer connection conductor vc is located between the first plate-shaped portion lower notch 144b and the first plate-shaped portion lower notch 144c in the left-right direction. The interlayer connection conductor vd is located between the first plate-shaped portion lower notch 144c and the first plate-shaped portion lower notch 144d in the left-right direction. The interlayer connection conductor ve is located between the first plate-shaped portion lower notch 144d and the first right lower notch 148 in the left-right direction.

As illustrated in FIGS. 1 and 3, the electronic components 16a and 16b (first electronic components) are mounted on the upper main surface SU2 of the substrate 12. A method for mounting the electronic component 16a is, for example, mounting by soldering. The electronic components 16a and 16b are semiconductor elements such as an IC or a power amplifier (PA), or a chip component such as a chip inductor, a chip capacitor, or a chip resistor. As illustrated in FIG. 2, the electronic components 16a and 16b are disposed in front of the first metal member 14. In the present embodiment, the electronic components 16a and 16b are disposed before the first metal member 14. Therefore, the electronic components 16a and 16b overlap the first metal member 14 when viewed in the front-back direction.

The electronic components 16c to 16e (second electronic components) are mounted on the upper main surface SU2 of the substrate 12. The method for mounting the electronic components 16c to 16e is, for example, mounting by soldering. The electronic components 16c to 16e are semiconductor elements such as IC or a power amplifier (PA), or a chip component such as a chip inductor, a chip capacitor, or a chip resistor. As illustrated in FIG. 2, the electronic components 16c to 16e are disposed behind the first metal member 14. In the present embodiment, the electronic components 16c to 16e are disposed behind the first metal member 14. Therefore, the electronic components 16c to 16e overlap the first metal member 14 when viewed in the front-back direction.

As illustrated in FIGS. 1 and 3, the sealing resin layer 18 is provided on the upper main surface SU2 of the substrate 12. The sealing resin layer 18 covers the first metal member 14 and the electronic components 16a to 16e. Thus, the sealing resin layer 18 protects the first metal member 14 and the electronic components 16a to 16e. The material of the sealing resin layer 18 is, for example, an epoxy resin. The sealing resin layer 18 has a rectangular parallelepiped shape. Therefore, the sealing resin layer 18 has an upper surface SU1, a lower surface SD1, a left surface SL1, a right surface SR1, a front surface SF1, and a back surface SB1. The first left support portion 150 is not exposed from the sealing resin layer 18 on the left surface SL1 of the sealing resin layer 18. The first right support portion 152 is not exposed from the sealing resin layer 18 on the right surface SR1 of the sealing resin layer 18. The upper end of the first plate-shaped portion 140, the upper end of the first left support portion 150, and the upper end of the first right support portion 152 are exposed to the upper surface SU1 of the sealing resin layer 18. As a result, the upper end of the first plate-shaped portion 140, the upper end of the first left support portion 150, and the upper end of the first right support portion 152 are exposed from the sealing resin layer 18 on the upper surface SU1 of the sealing resin layer 18.

The shield 20 covers the upper surface SU1 of the sealing resin layer 18. In the present embodiment, the shield 20 covers the upper surface SU1, the left surface SL1, the right surface SR1, the front surface SF1, and the back surface SB1 of the sealing resin layer 18, and the left surface SL2, the right surface SR2, the front surface SF2, and the back surface SB2 of the substrate 12. The shield 20 is electrically connected to the first metal member 14. Specifically, the shield 20 is in contact with a portion where the first metal member 14 is exposed from the sealing resin layer 18. Further, the shield 20 is connected to the ground conductor layer G exposed from the right surface SR2 of the substrate 12. Thus, the shield 20 is connected to the ground potential. The shield 20 has a multilayer structure. Specifically, the shield 20 includes an adhesion layer, a conductive layer, and a protective layer. The adhesion layer, the conductive layer, and the protective layer are stacked in this order from the lower layer to the upper layer. The adhesion layer serves to increase adhesion strength between the conductive layer and the sealing resin layer 18. The material of the adhesion layer is, for example, stainless steel (SUS). The conductive layer serves a shielding function. The material of the conductive layer is, for example, a metal such as Cu, Ag, or Al. The protective layer serves to prevent corrosion of the conductive layer. The material of the protective layer is, for example, SUS.

[Method for Manufacturing Module]

Figure 9:
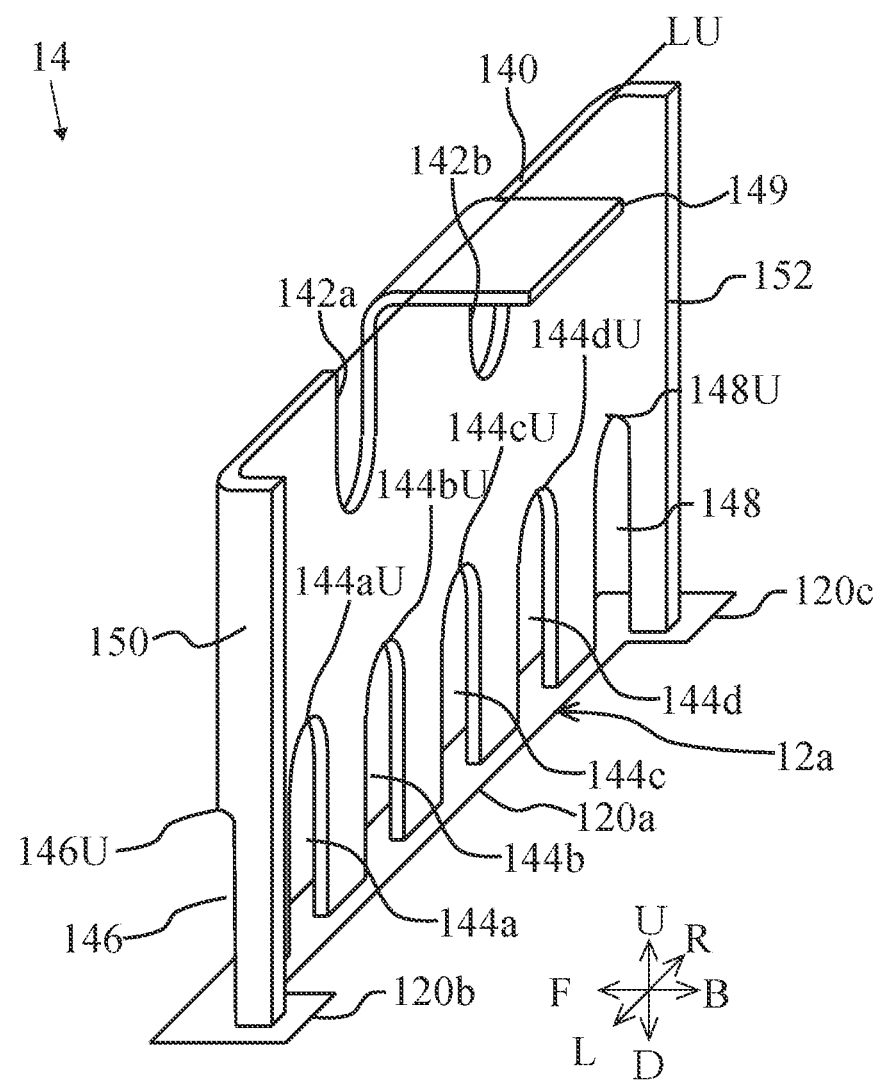
FIG. 9 is a perspective view at the time of mounting the first metal member 14.
Figure 10:
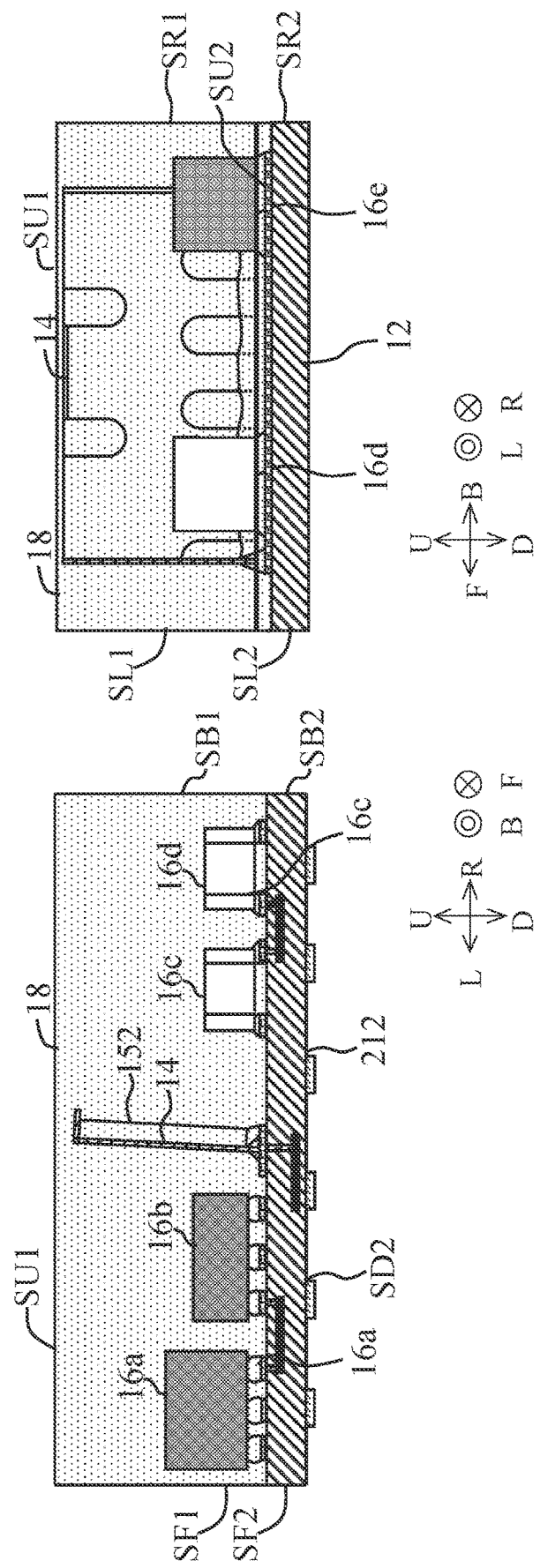
FIG. 10 is a cross-sectional view at the time of manufacturing the module 10.
Figure 11:
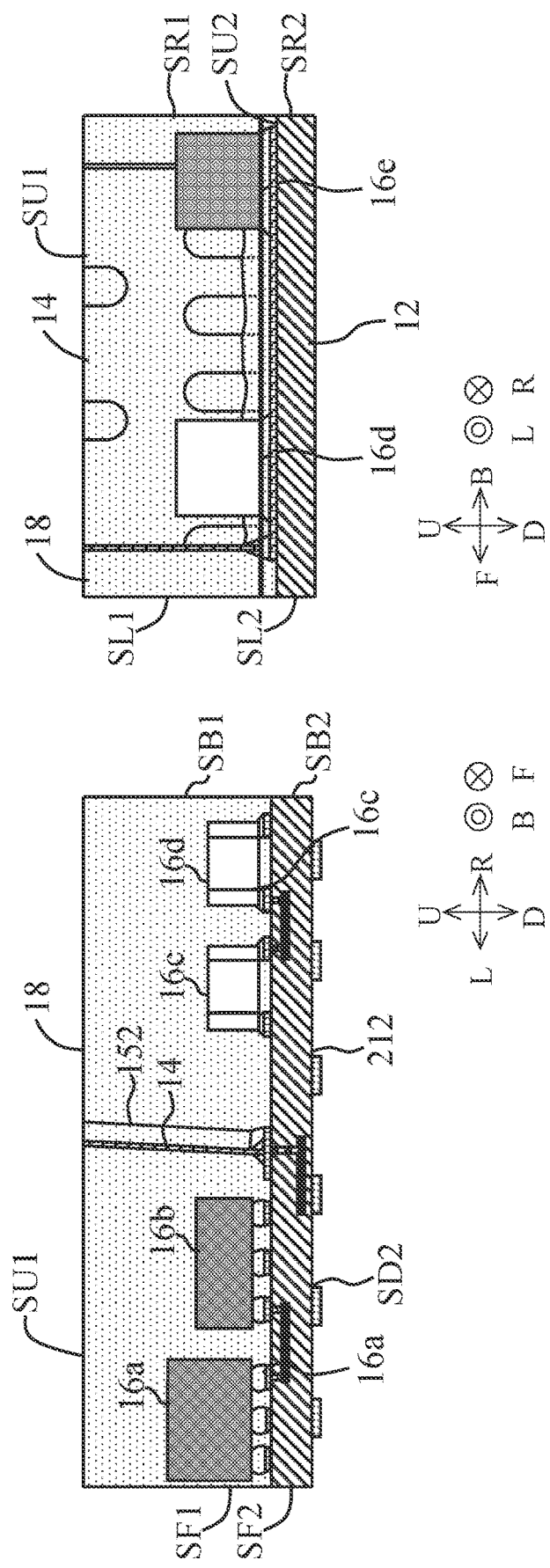
FIG. 11 is a cross-sectional view at the time of manufacturing the module 10.

Next, a method for manufacturing the module 10 will be described with reference to the drawings. FIG. 9 is a perspective view at the time of mounting the first metal member 14. FIGS. 10 and 11 are cross-sectional views at the time of manufacturing the module 10.

First, the electronic components 16a to 16e are mounted on the upper main surface SU2 of the substrate 12. Further, as illustrated in FIG. 9, the first metal member 14 is mounted on the substrate 12. Here, the first metal member 14 at the time of manufacturing the module 10 will be described. The first metal member 14 further includes a top surface portion 149. The top surface portion 149 is located between the first plate-shaped portion upper notch 142a and the first plate-shaped portion upper notch 142b when viewed in the front-back direction. The top surface portion 149 extends in the backward direction from the first plate-shaped portion upper side LU (see FIG. 4). The top surface portion 149 is formed by bending a part of the first metal member 14 in the backward direction. The top surface portion 149 is used for mounting the first metal member 14. Specifically, the top surface portion 149 is sucked using a mounting machine. Then, the first metal member 14 is moved by the mounting machine, and the lower end of the first plate-shaped portion 140, the lower end of the first left support portion 150, and the lower end of the first right support portion 152 are set on the mounting electrode 12a. Thereafter, the lower end of the first plate-shaped portion 140, the lower end of the first left support portion 150, and the lower end of the first right support portion 152 are fixed to the mounting electrode 12a by the solder 122. At this time, solder is applied to each of the lower end of the first plate-shaped portion 140, the lower end of the first left support portion 150, and the lower end of the first right support portion 152, and solder is also applied to the mounting electrode 12a.

Next, as illustrated in FIG. 10, the sealing resin layer 18 is formed on the upper main surface SU2 of the substrate 12. At this time, the sealing resin layer 18 is formed so that the sealing resin layer 18 covers the entire upper main surface SU2 of the substrate 12. Specifically, the substrate 12 is set in a mold. Then, a resin (molten resin) which is melted is injected into the mold. At this time, the molten resin passes through the first plate-shaped portion upper notches 142a and 142b and the first plate-shaped portion lower notches 144a to 144d and spreads over the entire upper main surface SU2 of the substrate 12. Then, the electronic components 16a to 16e and the first metal member 14 are located in the sealing resin layer 18. That is, the electronic components 16a to 16e and the first metal member 14 are not exposed from the sealing resin layer 18.

Next, as illustrated in FIG. 11, the upper main surface SU of the sealing resin layer 18 is ground with a grindstone. For example, the grindstone grinds the upper surface SU1 of the sealing resin layer 18 while moving in the backward direction with respect to the upper surface SU1 of the sealing resin layer 18. Thus, the upper end of the first plate-shaped portion 140 is exposed from the upper surface SU1 of the sealing resin layer 18. When the upper surface SU1 of the sealing resin layer 18 is ground, the top surface portion 149 of the first metal member 14 is ground.

Further, as illustrated in FIG. 11, by cutting the substrate 12 and the sealing resin layer 18 in the up-down direction using a dicer, the substrate 12 and the sealing resin layer 18 are divided. At this time, the left surface SL1, the right surface SR1, the front surface SF1, and the back surface SB1 of the sealing resin layer 18 are formed.

Next, the shield 20 is formed on the upper surface SU1, the left surface SL1, the right surface SR1, the front surface SF1, and the back surface SB1 of the sealing resin layer 18. Specifically, the adhesion layer, the conductive layer, and the protective layer are formed by performing sputtering three times. As described above, the surface roughness of the upper end, the left end, and the right end of the first metal member 14 is larger than the surface roughness of the front main surface SF3 and the back main surface SB3 of the first plate-shaped portion 140. Therefore, the adhesion layer adheres to the upper end, the left end, and the right end of the first metal member 14 with high adhesion strength. Through the above steps, the module 10 is completed.

[Effects]

According to the module 10, a region where the electronic component can be mounted can be widened. More specifically, the first left support portion 150 is bent with respect to the first plate-shaped portion 140 at the first left boundary B1 so as to be located behind the first plate-shaped portion 140. As a result, the first left support portion 150 is located at the left end portion of the first metal member 14. The first right support portion 152 is bent with respect to the first plate-shaped portion 140 at the first right boundary B2 so as to be located behind the first plate-shaped portion 140. As a result, the first right support portion 152 is located at the right end portion of the first metal member 14. Therefore, in the first metal member 14, there is no portion protruding in the forward direction or backward direction from the first plate-shaped portion 140 except for the left end portion and the right end portion of the first metal member 14. Therefore, the electronic component can be disposed close to the first plate-shaped portion 140. As a result, according to the module 10, a region where the electronic component can be mounted can be widened.

Figure 12:
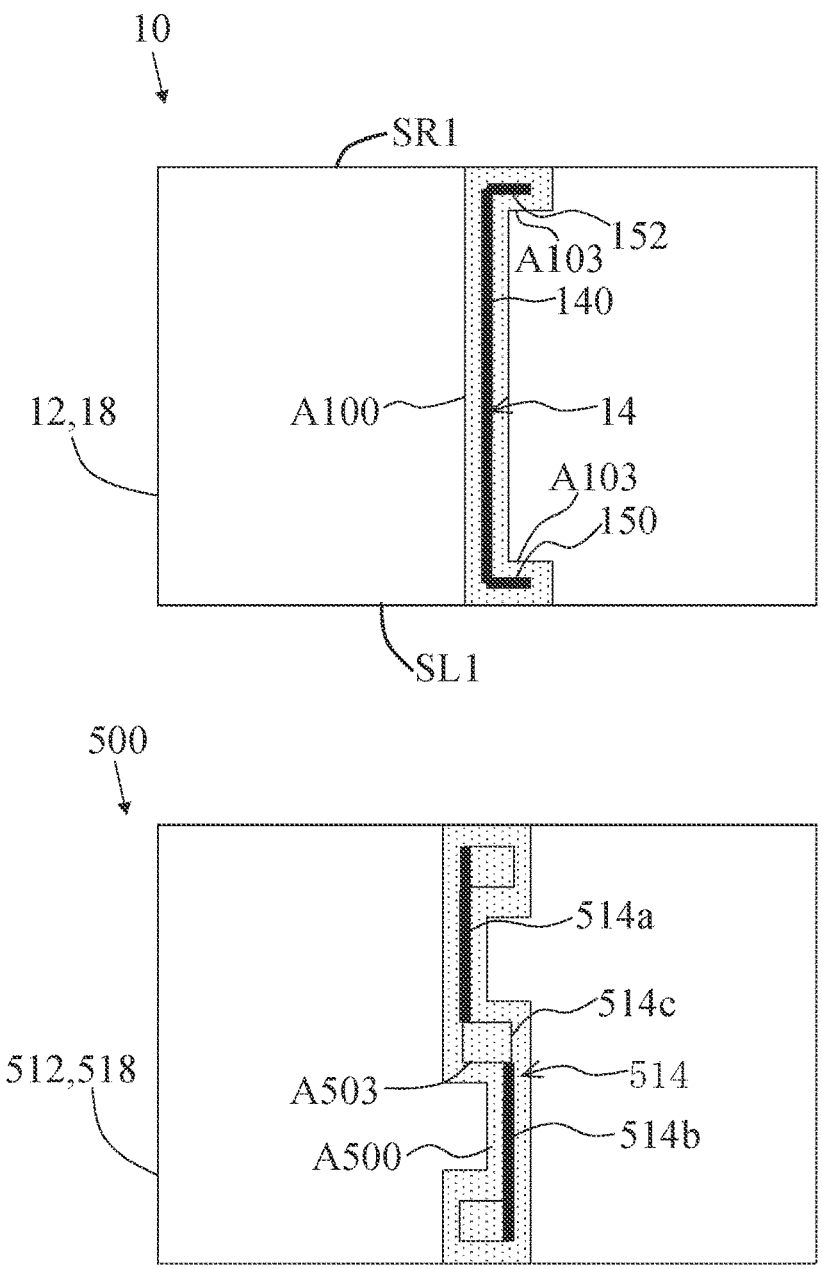
FIG. 12 is a top view of a circuit module 500 and a module 10 described in Patent Literature 1.

Further, according to the module 10, the region where the electronic component can be mounted can be widened also for the following reasons. FIG. 12 is a top view of a circuit module 500 and a module 10 described in Patent Literature 1.

More specifically, in the circuit module 500 described in Patent Literature 1, the conductive partition 514 includes a first component 514a, a second component 514b, and a third component 514c. The first component 514a and the second component 514b extend in the left-right direction when viewed in the up-down direction. The first component 514a is provided on the right front of the second component 514b. The front end of the third component 514c is connected to the left end of the first component 514a. The back end of the third component 514c is connected to the right end of the second component 514b.

In the conductive partition 514 and the first metal member 14, from the viewpoint of shielding property, it is often desired to dispose electronic components near the center of the conductive partition 514 in the left-right direction and near the center of the first metal member 14 in the left-right direction. However, in the conductive partition 514, a portion A503 where an electronic component cannot be disposed is formed at the center of the conductive partition 514 in the left-right direction.

On the other hand, in the module 10, a portion A103 where the electronic component cannot be disposed is formed at the left end portion and the right end portion of the first metal member 14. Therefore, it is easy to dispose the electronic component near the center of the first metal member 14 in the left-right direction. As described above, according to the module 10, the region where the electronic component can be mounted can be widened also for the following reasons.

In addition, the module 10 has the following effects when an electronic component that generates a magnetic flux is disposed in the vicinity of the first metal member 14. More specifically, there is a case where the first metal member 14 converts the magnetic flux into an eddy current and shields the eddy current. In this case, the magnetic flux may be perpendicularly incident on the first metal member 14. Therefore, in the module 10, the first left support portion 150 is bent with respect to the first plate-shaped portion 140 at the first left boundary B1 so as to be located behind the first plate-shaped portion 140. As a result, the first left support portion 150 is located at the left end portion of the first metal member 14. Similarly, the first right support portion 152 is bent with respect to the first plate-shaped portion 140 at the first right boundary B2 so as to be located behind the first plate-shaped portion 140. As a result, the first right support portion 152 is located at the right end portion of the first metal member 14. Therefore, in the first metal member 14, there is no portion protruding in the forward direction or backward direction from the first plate-shaped portion 140 except for the left end portion and the right end portion of the first metal member 14. As a result, the magnetic flux is easily perpendicularly incident on the first plate-shaped portion 140. As a result, the shielding effect of the first metal member 14 is improved.

Further, according to the module 10, the first left support portion 150 and the first right support portion 152 extend in the backward direction from the first plate-shaped portion 140. This makes it possible to shield the magnetic flux entering the module 10 from the left direction or the right direction of the module 10. Therefore, electronic components can be easily disposed near the left end portion and the right end portion of the first metal member 14.

According to the module 10, the occurrence of variations in the posture of the first metal member 14 is suppressed. More specifically, the first left support portion 150 is formed by bending the left end portion of the first metal member 14. When the first metal member 14 is bent, a protrusion protruding downward is formed at the lower end of the first left boundary B1 which is a bending line of the first metal member 14. When such protrusions come into contact with the mounting electrode 12a, variations occur in the posture of the first metal member 14.

Therefore, in the module 10, the first left lower notch 146 extending in the upward direction from the lower end of the first plate-shaped portion 140 and the lower end 150D of the first left support portion 150 is provided so that the lower end B1D of the first left boundary B1 is located above the lower end of the first plate-shaped portion 140 and the lower end 150D of the first left support portion 150. This prevents the protrusion from protruding below the lower end of the first plate-shaped portion 140 and the lower end 150D of the first left support portion 150. As a result, the protrusion is prevented from coming into contact with the mounting electrode 12a. As described above, the occurrence of variations in the posture of the first metal member 14 is suppressed.

According to the module 10, the first metal member 14 can be bent with high accuracy. More specifically, in the module 10, the first left lower notch 146 extending in the upward direction from the lower end of the first plate-shaped portion 140 and the lower end 150D of the first left support portion 150 is provided so that the lower end of the first left boundary B1 is located above the lower end of the first plate-shaped portion 140 and the lower end 150D of the first left support portion 150. Therefore, the amount of metal on the first left boundary B1 decreases. As a result, the first metal member 14 can be easily bent. Therefore, according to the module 10, the first metal member 14 can be bent with high accuracy.

In particular, in the module 10, the position of the upper end 146U of the first left lower notch 146 in the up-down direction is the same as the position of the upper ends 144aU to 144dU of the first plate-shaped portion lower notches 144a to 144d in the up-down direction. Therefore, the length of the first left lower notch 146 in the up-down direction is large. As a result, the protrusion is more effectively suppressed from protruding below the lower end of the first plate-shaped portion 140 and the lower end 150D of the first left support portion 150. As described above, according to the module 10, the occurrence of variations in the posture of the first metal member 14 is suppressed.

According to the module 10, it is possible to suppress the first metal member 14 from falling at the time of forming the sealing resin layer 18. More specifically, in the module 10, the first left support portion 150 extends in the backward direction from the left end of the first plate-shaped portion 140. Therefore, when the first metal member 14 receives pressure in the backward direction by the molten resin, the first metal member 14 is supported by the first left support portion 150. As a result, according to the module 10, it is possible to suppress the first metal member 14 from falling at the time of forming the sealing resin layer 18.

According to the module 10, in the substrate 12, the shielding property between the region in front of the first metal member 14 and the region after the first metal member 14 is improved. More specifically, the substrate 12 includes the interlayer connection conductors va to ve and the ground conductor layer G. The interlayer connection conductors va to ve are arranged at equal intervals under the first metal member 14. The interval between the adjacent interlayer connection conductors va to ve is, for example, ¼ of the wavelength of the high frequency signal transmitted through the signal conductor layer (not illustrated) of the substrate 12. As a result, the electromagnetic wave of the high frequency signal transmitted through the signal conductor layer attempts to generate a standing wave in the interlayer connection conductors va to ve. However, the interlayer connection conductors va to ve are connected to the ground conductor layer G. Therefore, the electromagnetic wave of the high frequency signal transmitted through the signal conductor layer flows to the ground via the interlayer connection conductors va to ve and the ground conductor layer G. Therefore, the electromagnetic wave of the high frequency signal transmitted through the signal conductor layer hardly passes through the interlayer connection conductors va to ve in the front-back direction. As a result, according to the module 10, in the substrate 12, the shielding property between the region in front of the first metal member 14 and the region after the first metal member 14 is improved.

According to the module 10, it is possible to suppress the first metal member 14 from falling at the time of forming the sealing resin layer 18. More specifically, the first plate-shaped portion 140 is provided with the first plate-shaped portion lower notches 144a to 144d. Therefore, the molten resin can pass through the first plate-shaped portion lower notches 144a to 144d. As a result, application of a large pressure to the first metal member 14 is suppressed. Therefore, it is possible to suppress the first metal member 14 from falling at the time of forming the sealing resin layer 18.

According to the module 10, it is possible to suppress the first metal member 14 from falling at the time of forming the sealing resin layer 18. More specifically, the first plate-shaped portion 140 is provided with the first plate-shaped portion upper notches 142a and 142b extending in the downward direction from the first plate-shaped portion upper side LU. As a result, the molten resin can pass through the first plate-shaped portion upper notches 142a and 142b. As a result, application of a large pressure to the first metal member 14 is suppressed. Therefore, it is possible to suppress the first metal member 14 from falling at the time of forming the sealing resin layer 18.

According to the module 10, it is possible to suppress the first metal member 14 from falling at the time of forming the sealing resin layer 18. More specifically, the first plate-shaped portion 140 is provided with the first plate-shaped portion upper notches 142a and 142b and the first plate-shaped portion lower notches 144a to 144d. Therefore, the magnitude of the pressure applied to the first plate-shaped portion 140 by the molten resin approaches uniformity throughout the first plate-shaped portion 140. As a result, according to the module 10, it is possible to suppress the first metal member 14 from falling at the time of forming the sealing resin layer 18.

According to the module 10, the first metal member 14 is suppressed from greatly tilting in the front-back direction. More specifically, the first plate-shaped portion 140 forms an angle substantially perpendicular to the substrate 12. As a result, as illustrated in FIG. 7, the solder 122 uniformly adheres to the front main surface SF3 and the back main surface SB3 of the first plate-shaped portion 140. Therefore, the magnitude of the force by which the first plate-shaped portion 140 is pulled in the forward direction by the surface tension of the solder 122 is substantially equal to the magnitude of the force by which the first plate-shaped portion 140 is pulled in the backward direction by the surface tension of the solder 122. As a result, the first metal member 14 is suppressed from greatly tilting in the front-back direction.

According to the module 10, the first metal member 14 includes the first left support portion 150. As a result, noise that tries to enter the module 10 from the left of the module 10 is absorbed by the first left support portion 150. As a result, noise is suppressed from entering the module 10. Further, the first left support portion 150 absorbs noise directed to the left direction from the module 10. As a result, the emission of noise from the module 10 is suppressed. As described above, the shielding property of the module 10 is improved.

According to the module 10, the grinding amount of the upper surface SU1 of the sealing resin layer 18 can be reduced. More specifically, in the module 10, the upper surface SU1 of the sealing resin layer 18 is ground after the entire first metal member 14 of FIG. 9 is covered with the sealing resin layer 18. At this time, the upper surface SU1 of the sealing resin layer 18 is ground until the height of the sealing resin layer 18 in the up-down direction reaches a design value.

Here, when the first plate-shaped portion 140 is slightly inclined in the forward direction with respect to the up-down direction, the top surface portion 149 in FIG. 9 is slightly inclined in the upward direction with respect to the front-back direction. In this case, the top surface portion 149 is located above the upper end of the first plate-shaped portion 140. Therefore, it is necessary to increase the height of the sealing resin layer 18 in the up-down direction to cover the entire first metal member 14 with the sealing resin layer 18. As a result, when the upper surface SU1 of the sealing resin layer 18 is ground until the height of the sealing resin layer 18 in the up-down direction reaches the design value, the cutting amount of the sealing resin layer 18 increases.

On the other hand, in the module 10, the first plate-shaped portion 140 is slightly inclined in the backward direction with respect to the up-down direction. In this case, the top surface portion 149 in FIG. 9 is slightly inclined in the downward direction with respect to the front-back direction. In this case, the top surface portion 149 is located below the upper end of the first plate-shaped portion 140. Therefore, the entire first metal member 14 can be covered with the sealing resin layer 18 without increasing the height of the sealing resin layer 18 in the up-down direction. Therefore, when the upper surface SU1 of the sealing resin layer 18 is ground until the height of the sealing resin layer 18 in the up-down direction reaches the design value, the cutting amount of the sealing resin layer 18 can be reduced.

In the module 10, the mounting electrode 12a includes one electrode. Thus, the interlayer connection conductors va to ve are electrically connected by the mounting electrode 12a. Therefore, the interlayer connection conductors va to ve may be arranged in any manner as long as the interlayer connection conductors va to ve are connected to the mounting electrode 12a. That is, the degree of freedom in arrangement of the interlayer connection conductors va to ve is increased. As a result, it is easy to adopt the arrangement of the interlayer connection conductors va to ve that improves the shielding property.

In the module 10, the first left lower notch 146 extending in the upward direction from the lower end of the first plate-shaped portion 140 and the lower end 150D of the first left support portion 150 is provided so that the lower end of the first left boundary B1 is located above the lower end (that is, the first plate-shaped portion lower side LD) of the first plate-shaped portion 140 and the lower end 150D of the first left support portion 150. That is, the first left lower notch 146 is provided under the first left boundary B1 between the first plate-shaped portion 140 and the first left support portion 150. Therefore, the molten resin in the vicinity of the first left boundary B1 can pass through the first left lower notch 146. As a result, the molten resin is suppressed from staying in the vicinity of the first left boundary B1. Therefore, the entire module 10 is uniformly filled with the molten resin.

Therefore, in the module 10, the first plate-shaped portion 140 is slightly inclined in the backward direction with respect to the up-down direction. As a result, solder easily adheres to the first left support portion 150 and the first right support portion 152. As a result, the first metal member 14 is firmly fixed to the mounting electrode 12a.

(First Modification)

Figure 13:
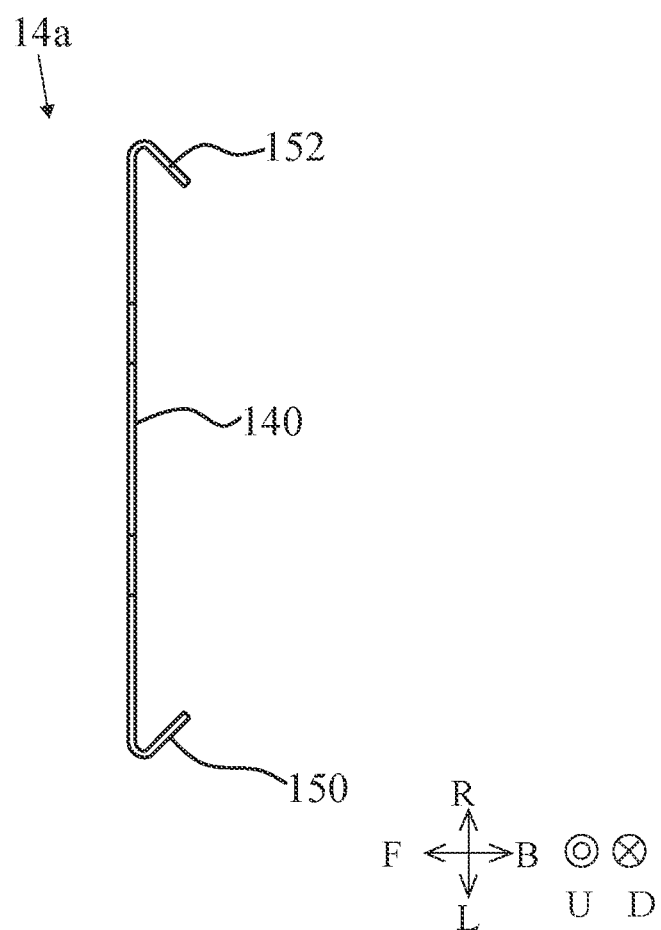

Hereinafter, a first metal member 14a according to a first modification will be described with reference to the drawings. FIG. 13 is a top view of the first metal member 14a.

The first metal member 14a is different from the first metal member 14 in an angle formed by the first plate-shaped portion 140 and the first left support portion 150 and an angle formed by the first plate-shaped portion 140 and the first right support portion 152. The angle formed by the first plate-shaped portion 140 and the first left support portion 150 and the angle formed by the first plate-shaped portion 140 and the first right support portion 152 are 45° as illustrated in FIG. 13. That is, the first right support portion 152 is bent by 135°. Since other structures of the first metal member 14a are the same as those of the first metal member 14, the description thereof will be omitted.

(Second Modification)

Figure 14:
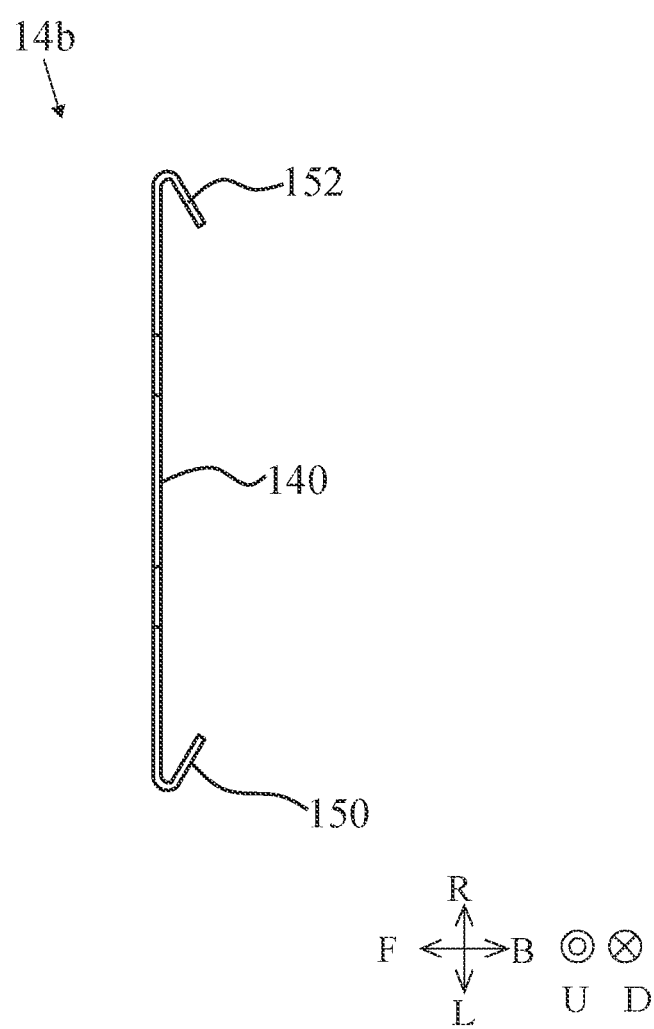
FIG. 14 is a top view of a first metal member 14b.

Hereinafter, a first metal member 14b according to a second modification will be described with reference to the drawings. FIG. 14 is a top view of the first metal member 14b.

The first metal member 14b is different from the first metal member 14 in an angle formed by the first plate-shaped portion 140 and the first left support portion 150 and an angle formed by the first plate-shaped portion 140 and the first right support portion 152. The angle formed by the first plate-shaped portion 140 and the first left support portion 150 and the angle formed by the first plate-shaped portion 140 and the first right support portion 152 are 30° as illustrated in FIG. 14. That is, the first right support portion 152 is bent by 150°. Since other structures of the first metal member 14b are the same as those of the first metal member 14, the description thereof will be omitted.

(Third Modification)

Figure 15:
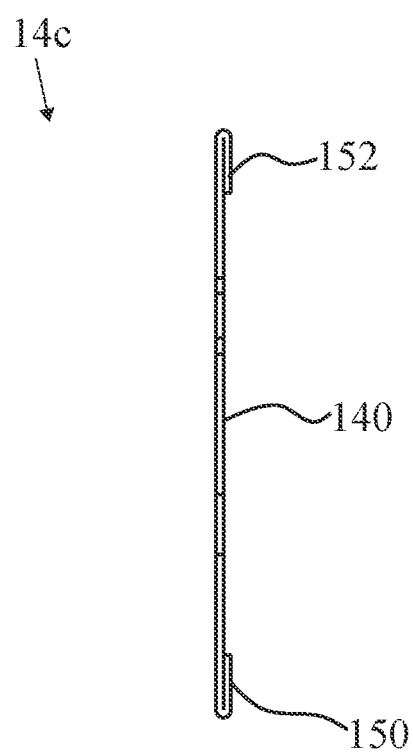
FIG. 15 is a top view of a first metal member 14c.

Hereinafter, a first metal member 14c according to a third modification will be described with reference to the drawings. FIG. 15 is a top view of the first metal member 14c.

The first metal member 14c is different from the first metal member 14 in an angle formed by the first plate-shaped portion 140 and the first left support portion 150 and an angle formed by the first plate-shaped portion 140 and the first right support portion 152. The angle formed by the first plate-shaped portion 140 and the first left support portion 150 and the angle formed by the first plate-shaped portion 140 and the first right support portion 152 are 0° as illustrated in FIG. 15. That is, the first right support portion 152 is bent by 180°. Since other structures of the first metal member 14c are the same as those of the first metal member 14, the description thereof will be omitted.

(Fourth Modification)

Figure 16:
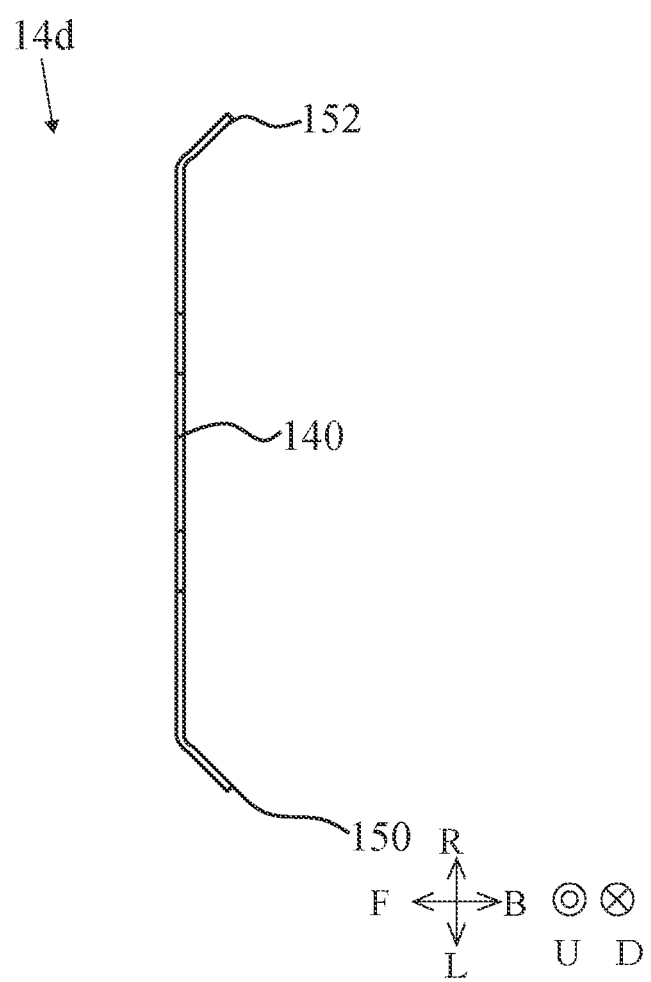
FIG. 16 is a top view of a first metal member 14d.

Hereinafter, a first metal member 14d according to a fourth modification will be described with reference to the drawings. FIG. 16 is a top view of the first metal member 14d.

The first metal member 14d is different from the first metal member 14 in an angle formed by the first plate-shaped portion 140 and the first left support portion 150 and an angle formed by the first plate-shaped portion 140 and the first right support portion 152. The angle formed by the first plate-shaped portion 140 and the first left support portion 150 and the angle formed by the first plate-shaped portion 140 and the first right support portion 152 are 135° as illustrated in FIG. 16. That is, the first right support portion 152 is bent by 45°. Since other structures of the first metal member 14d are the same as those of the first metal member 14, the description thereof will be omitted.

(Fifth Modification)

Figure 17:
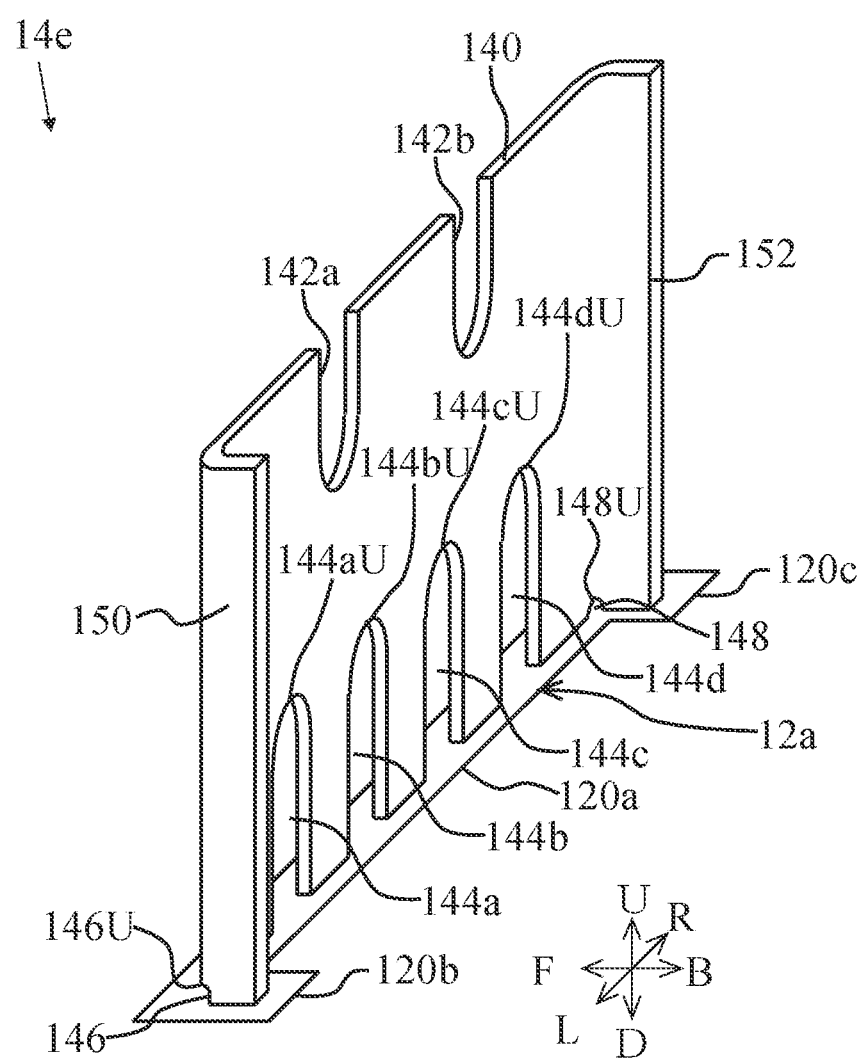
FIG. 17 is a perspective view of a first metal member 14e.

Hereinafter, a first metal member 14e according to a fifth modification will be described with reference to the drawings. FIG. 17 is a perspective view of the first metal member 14e.

The first metal member 14e is different from the first metal member 14 in the shapes of the first left lower notch 146 and the first right lower notch 148. More specifically, the upper end 146U of the first left lower notch 146 is located below the upper ends 144aU to 144dU of the first plate-shaped portion lower notches 144a to 144d. That is, the depth of the first left lower notch 146 is shallower than the depths of the first plate-shaped portion lower notches 144a to 144d. Similarly, the upper end 148U of the first right lower notch 148 is located below the upper ends 144aU to 144dU of the first plate-shaped portion lower notches 144a to 144d. That is, the depth of the first right lower notch 148 is shallower than the depths of the first plate-shaped portion lower notches 144a to 144d. Since other structures of the first metal member 14e are the same as those of the first metal member 14, the description thereof will be omitted. Similarly to the first metal member 14, the first metal member 14e having such a structure also suppresses variations in the posture of the first metal member 14e.

(Sixth Modification)

Figure 18:
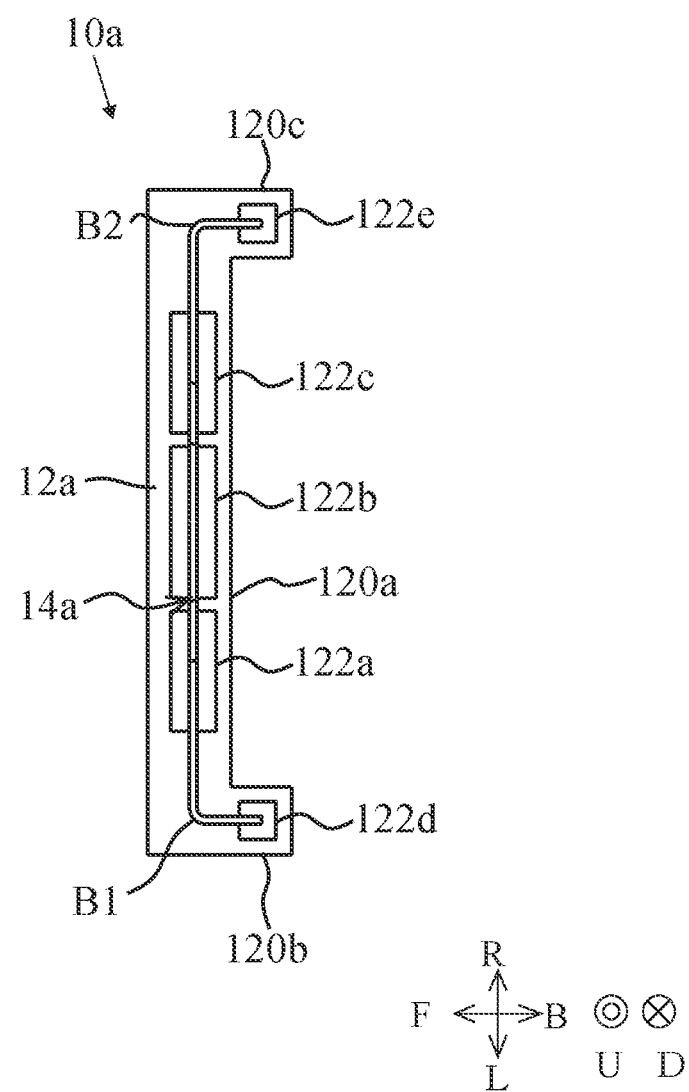

Hereinafter, a module 10a according to a sixth modification will be described with reference to the drawings. FIG. 18 is a top view of a first metal member 14, a mounting electrode 12a, and a solder 122 of the module 10a.

The module 10a differs from the module 10 in the shapes of the solders 122a to 122e. In the module 10a, the solders 122a to 122c are provided in the mounting electrode main portion 120a. The solders 122a to 122c are arranged in this order from left to right. The solder 122d is provided at the mounting electrode left end portion 120b. The solder 122e is provided at the mounting electrode right end portion 120c. As a result, the solder does not overlap the vicinity of the first left boundary B1 and the vicinity of the first right boundary B2 of the first metal member 14 when viewed in the up-down direction. Adhesion of solder to the first left boundary B1 and the first right boundary B2 is suppressed. Therefore, the first metal member 14 hardly falls in the forward direction or the backward direction. Since other structures of the module 10a are the same as those of the module 10, description thereof is omitted.

(Seventh Modification)

Figure 19:
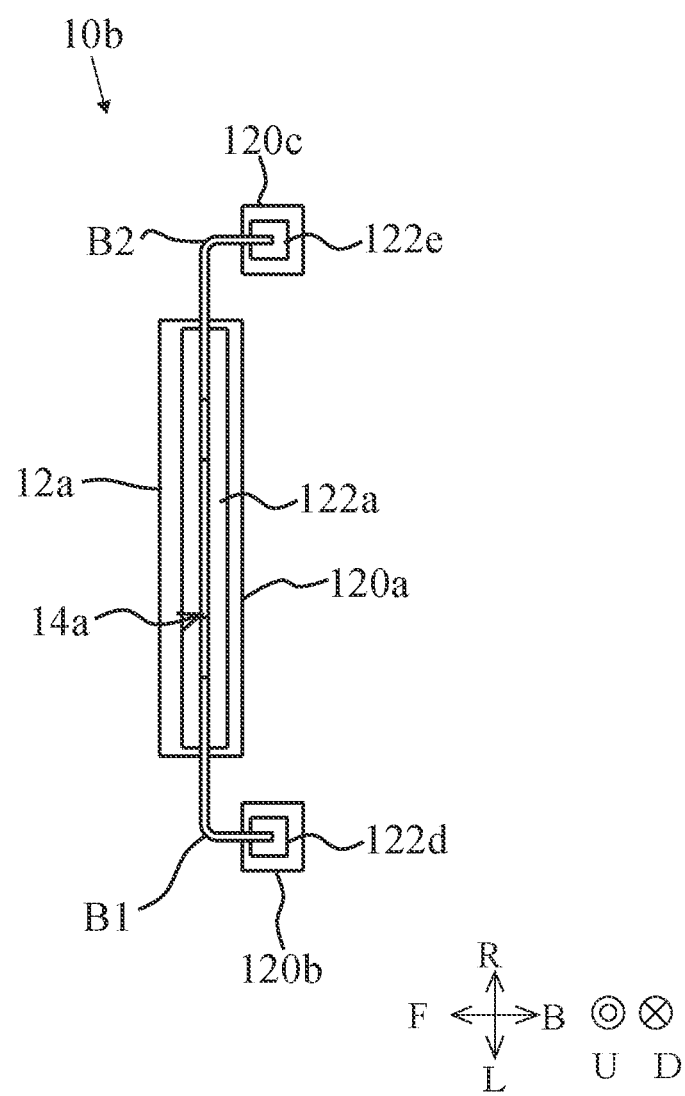
FIG. 19 is a top view of the first metal member 14, the mounting electrode 12a, and the solder 122 of a module 10b.

Hereinafter, a module 10b according to a seventh modification will be described with reference to the drawings. FIG. 19 is a top view of a first metal member 14, a mounting electrode 12a, and a solder 122 of the module 10b.

The module 10b is different from the module 10 in the shape of the mounting electrode 12a. In the module 10a, the mounting electrode main portion 120a, the mounting electrode left end portion 120b, and the mounting electrode right end portion 120c are separated. As a result, the mounting electrode 12a does not overlap the vicinity of the first left boundary B1 and the vicinity of the first right boundary B2 of the first metal member 14 when viewed in the up-down direction. Therefore, the solders 122a, 122d, and 122e do not overlap the vicinity of the first left boundary B1 and the vicinity of the first right boundary B2 of the first metal member 14. Since other structures of the module 10b are the same as those of the module 10, description thereof is omitted.

In the module 10b, since the mounting electrode 12a is separated into the mounting electrode main portion 120a, the mounting electrode left end portion 120b, and the mounting electrode right end portion 120c, solder is less likely to wet and spread on the mounting electrode 12a. Therefore, the possibility that the solder gets wet on the first left boundary B1 and the first right boundary B2 is further reduced.

(Eighth Modification)

Figure 20:
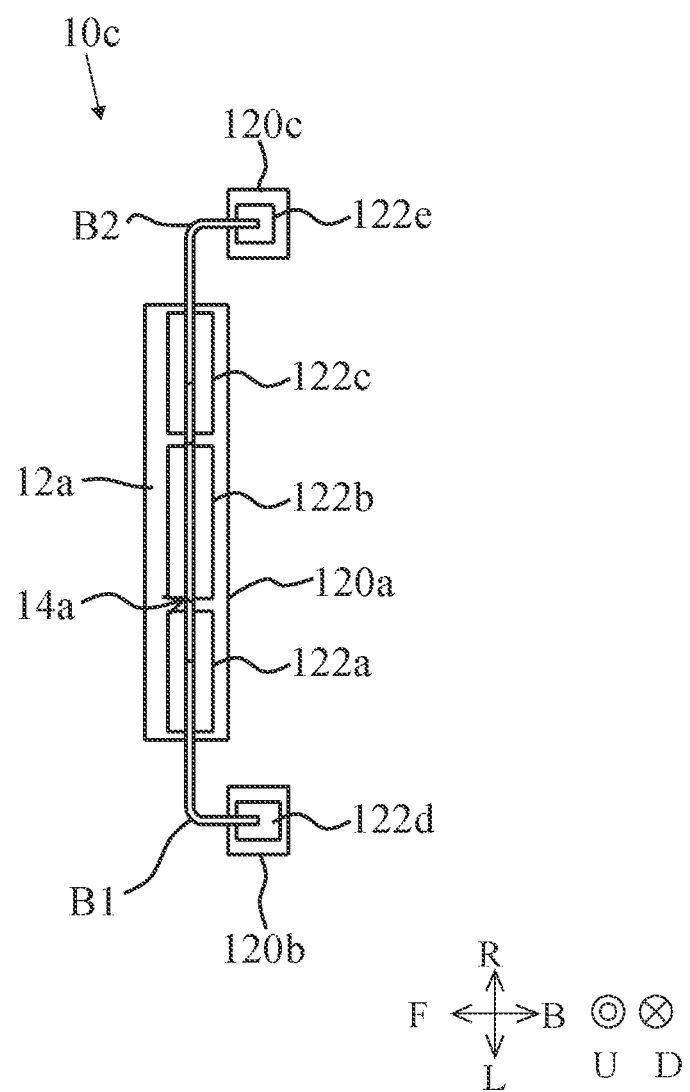
FIG. 20 is a top view of the first metal member 14, the mounting electrode 12a, and solders 122a to 122e of a module 10c.

Hereinafter, a module 10c according to a eighth modification will be described with reference to the drawings. FIG. 20 is a top view of a first metal member 14, a mounting electrode 12a, and solders 122a to 122e of the module 10c.

The module 10c is different from the module 10a in the shape of the mounting electrode 12a. In the module 10a, the mounting electrode main portion 120a, the mounting electrode left end portion 120b, and the mounting electrode right end portion 120c are separated. As a result, the mounting electrode 12a does not overlap the vicinity of the first left boundary B1 and the vicinity of the first right boundary B2 of the first metal member 14 when viewed in the up-down direction. Further, the solders 122a to 122c are provided in the mounting electrode main portion 120a. The solder 122d is provided at the mounting electrode left end portion 120b. The solder 122e is provided at the mounting electrode right end portion 120c. Therefore, the solders 122a to 122e do not overlap the vicinity of the first left boundary B1 and the vicinity of the first right boundary B2 of the first metal member 14. Since other structures of the module 10c are the same as those of the module 10, description thereof is omitted.

(Ninth Modification)

Figure 21:
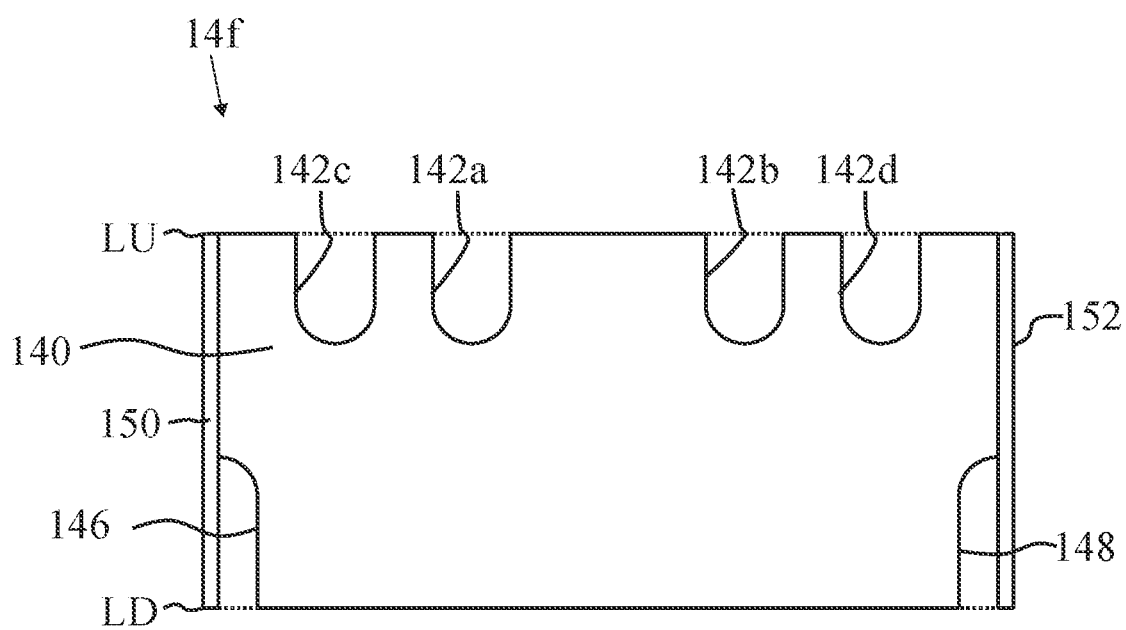
FIG. 21 is a rear view of a first metal member 14f according to a ninth modification.
Figure 21:
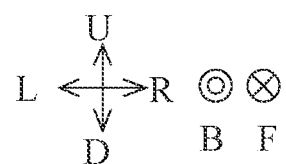

Hereinafter, a first metal member 14f according to a ninth modification will be described with reference to the drawings. FIG. 21 is a rear view of the first metal member 14f according to the ninth modification.

The first metal member 14f is different from the first metal member 14 in that the first plate-shaped portion lower notches 144a to 144d are not provided. Since other structures of the first metal member 14f are the same as those of the first metal member 14, the description thereof will be omitted.

(Tenth Modification)

Figure 22:
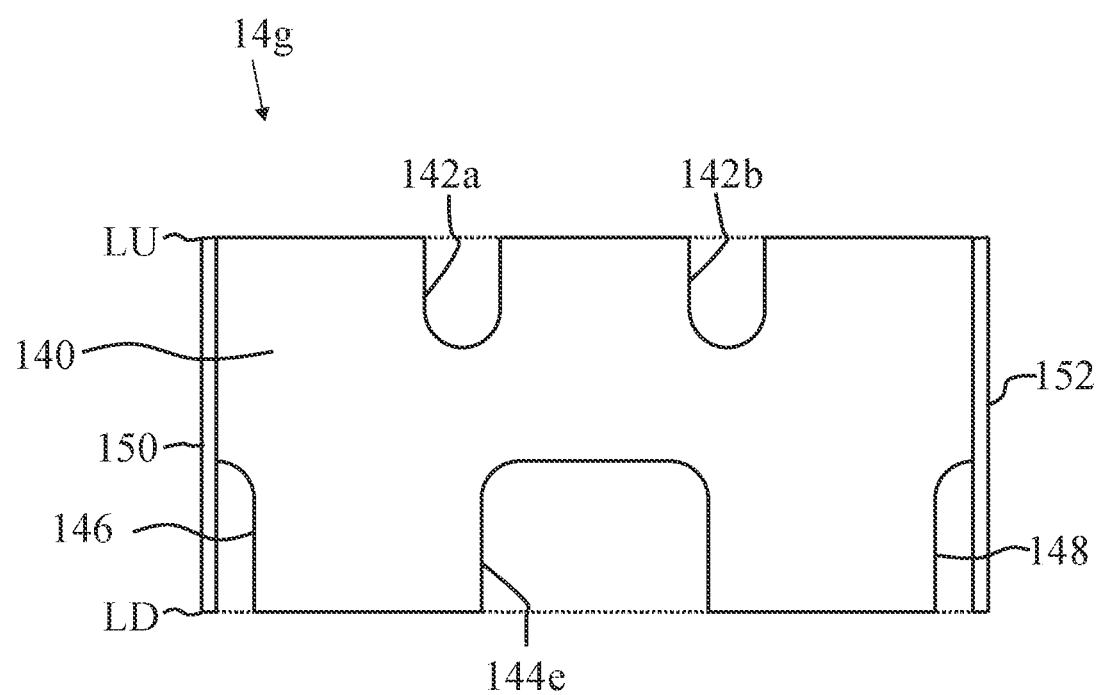
FIG. 22 is a rear view of a first metal member 14g according to a tenth modification.
Figure 22:
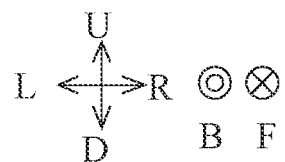

Hereinafter, a first metal member 14g according to a tenth modification will be described with reference to the drawings. FIG. 22 is a rear view of the first metal member 14g according to the tenth modification.

The first metal member 14g is different from the first metal member 14 in that the first plate-shaped portion lower notches 144a and 144d are not provided and the first plate-shaped portion lower notches 144b and 144c are connected to form one first plate-shaped portion lower notch 144e. Since other structures of the first metal member 14g are the same as those of the first metal member 14, the description thereof will be omitted.

(Eleventh Modification)

Figure 23:
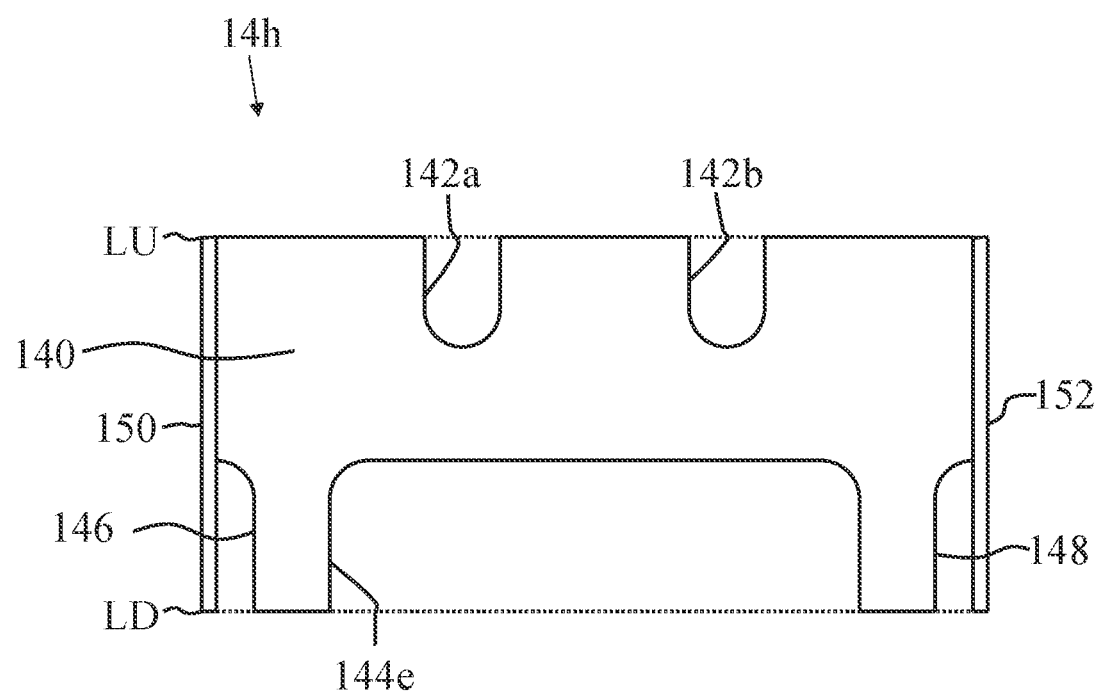
FIG. 23 is a rear view of a first metal member 14h according to an eleventh modification.
Figure 23:
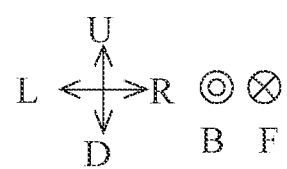

Hereinafter, a first metal member 14h according to an eleventh modification will be described with reference to the drawings. FIG. 23 is a rear view of the first metal member 14h according to the eleventh modification.

The first metal member 14h is different from the first metal member 14g in that the left and right widths of the first plate-shaped portion lower notch 144e are large. Since other structures of the first metal member 14h are the same as those of the first metal member 14g, the description thereof will be omitted.

(Twelfth Modification)

Figure 24:
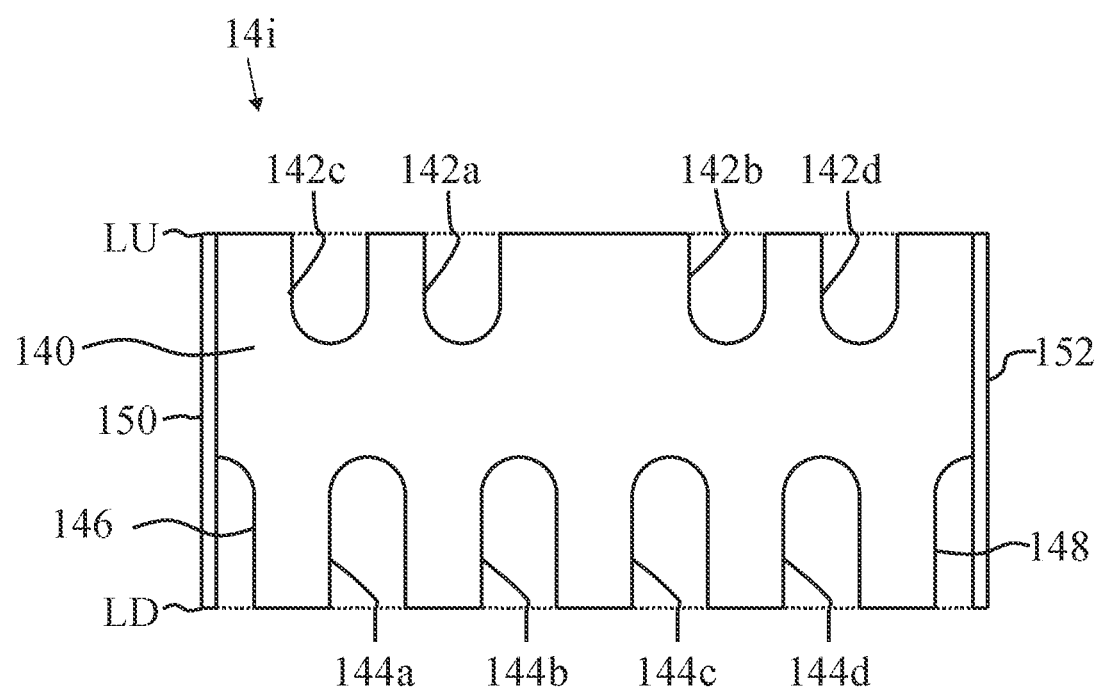
FIG. 24 is a rear view of a first metal member 14i according to a twelfth modification.
Figure 24:
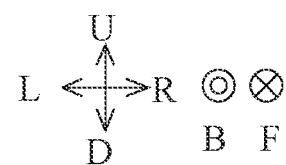

Hereinafter, a first metal member 14i according to a twelfth modification will be described with reference to the drawings. FIG. 24 is a rear view of the first metal member 14i according to the twelfth modification.

The first metal member 14i is different from the first metal member 14 in that first plate-shaped portion upper notches 142c and 142d are provided. The first plate-shaped portion upper notch 142c is provided on the left of the first plate-shaped portion upper notch 142a. The first plate-shaped portion upper notch 142d is provided on the right of the first plate-shaped portion upper notch 142b. Since other structures of the first metal member 14i are the same as those of the first metal member 14, the description thereof will be omitted.

(Thirteenth Modification)

Figure 25:
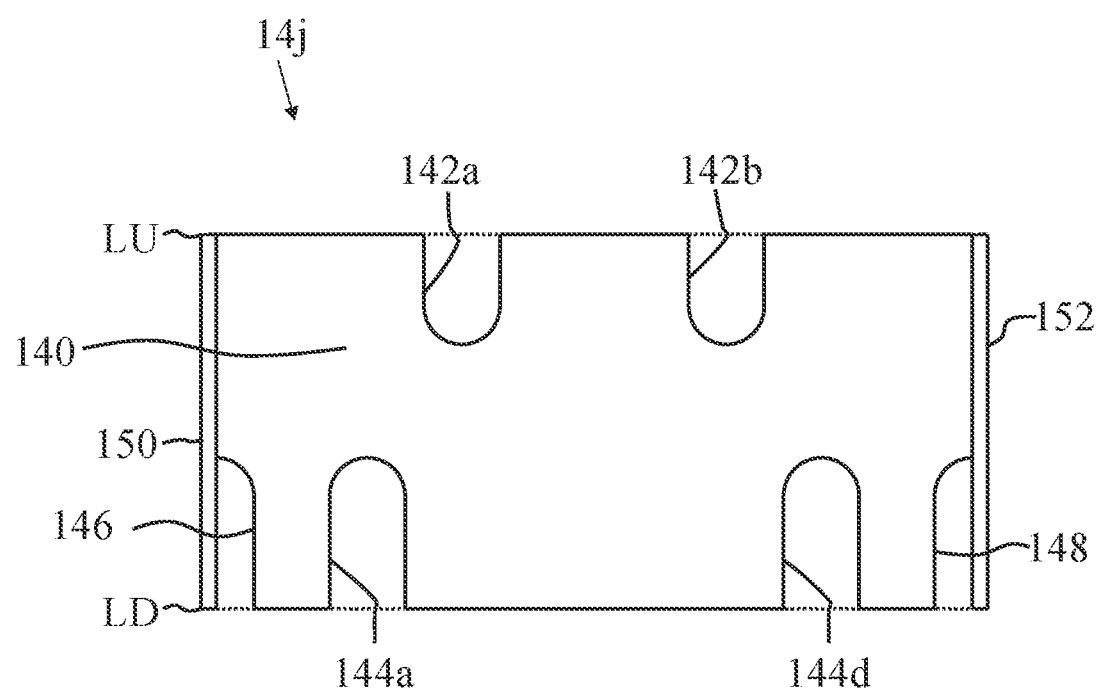
FIG. 25 is a rear view of a first metal member 14j according to a thirteenth modification.
Figure 25:
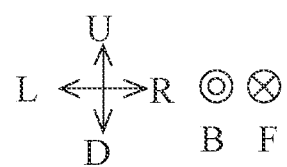

Hereinafter, a first metal member 14j according to a thirteenth modification will be described with reference to the drawings. FIG. 25 is a rear view of the first metal member 14j according to the thirteenth modification.

The first metal member 14j is different from the first metal member 14 in that the first plate-shaped portion lower notches 144c and 144d are not provided. Since other structures of the first metal member 14j are the same as those of the first metal member 14, the description thereof will be omitted.

(Fourteenth Modification)

Figure 26:
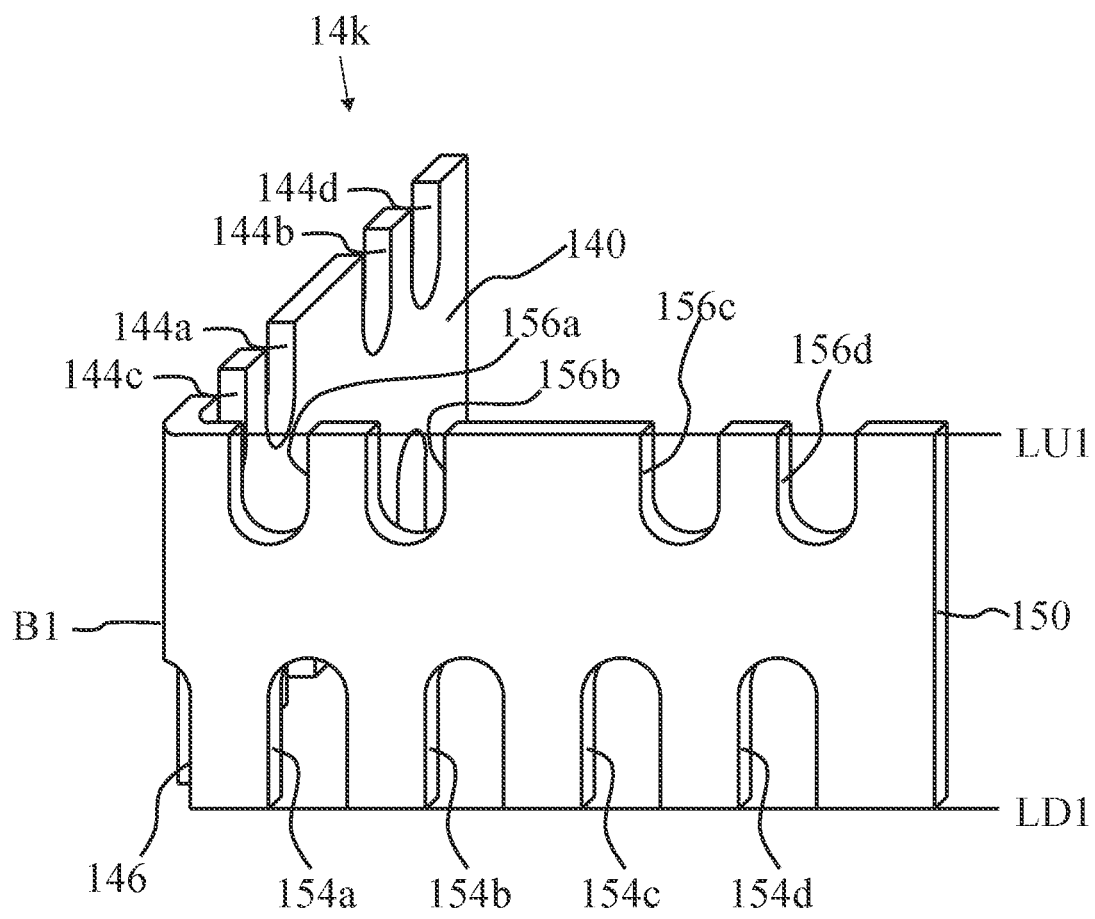
FIG. 26 is a perspective view of a first metal member 14k according to a fourteenth modification.
Figure 27:
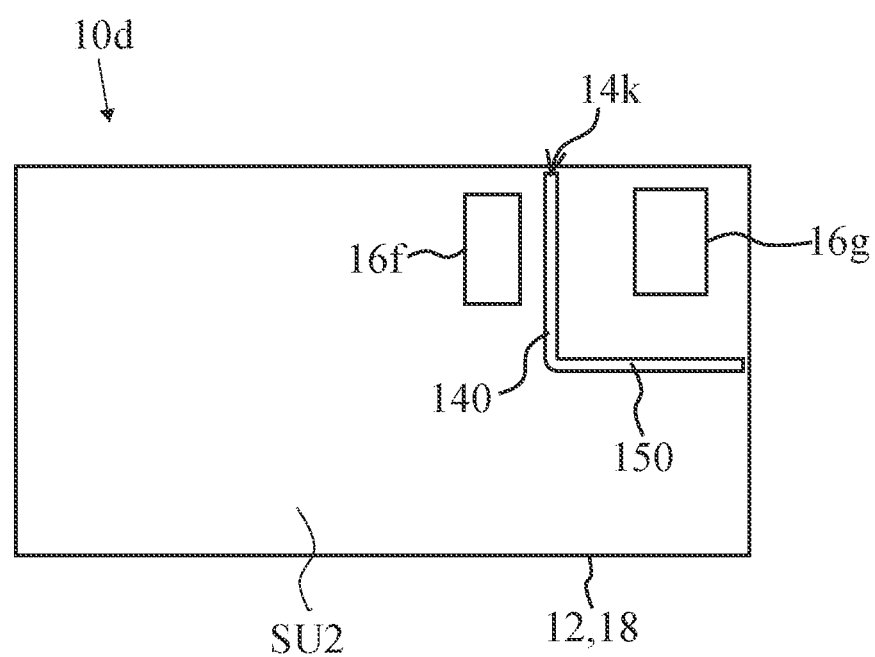
FIG. 27 is a top view of a module 10d including the first metal member 14k.
Figure 27:
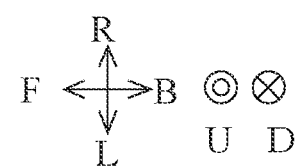

Hereinafter, a first metal member 14k according to a fourteenth modification will be described with reference to the drawings. FIG. 26 is a perspective view of the first metal member 14k according to the fourteenth modification. FIG. 27 is a top view of the module 10d including the first metal member 14k.

The first metal member 14k is different from the first metal member 14 in that the length of the first left support portion 150 in the front-back direction is long. More specifically, the first left support portion 150 extends in the backward direction from the left end of the first plate-shaped portion 140. The length of the first left support portion 150 in the front-back direction is equal to the length of the first plate-shaped portion 140 in the left-right direction. When viewed in the left-right direction, a side connecting the lower end of the first left support portion 150 in the front-back direction is defined as a first left support portion lower side LD1. The first left support portion 150 is provided with first left support portion lower notches 154a to 154d extending in the upward direction from the first left support portion lower side LD1.

When viewed in the left-right direction, a side connecting the upper end of the first left support portion 150 in the front-back direction is defined as a first left support portion upper side LU1. The first left support portion 150 is provided with first left support portion upper notches 156a to 156d extending in the downward direction from the first left support portion upper side LU1. The first metal member 14k is not provided with the first right support portion 152. Since other structures of the first metal member 14k are the same as those of the first metal member 14, the description thereof will be omitted.

As illustrated in FIG. 27, the first metal member 14k and electronic components 16f and 16g are provided on the upper main surface SU2 of the substrate 12 of the module 10d. The electronic component 16f is disposed before the first plate-shaped portion 140. The electronic component 16g is disposed behind the first plate-shaped portion 140. The electronic component 16g is disposed on the right of the first left support portion 150. Therefore, the electronic component 16g is surrounded by the first metal member 14k.

In the module 10d as described above, in the first metal member 14k, the shielding effect of the electronic component 16g with respect to the forward direction and the left direction is enhanced.

Further, according to the first metal member 14k, it is possible to obtain an L-shaped structure without connecting a plurality of metal members. Therefore, in the first metal member 14k, since no gap is formed between the plurality of metal members, a high shielding effect of the first metal member 14a can be obtained.

(Fifteenth Modification)

Figure 28:
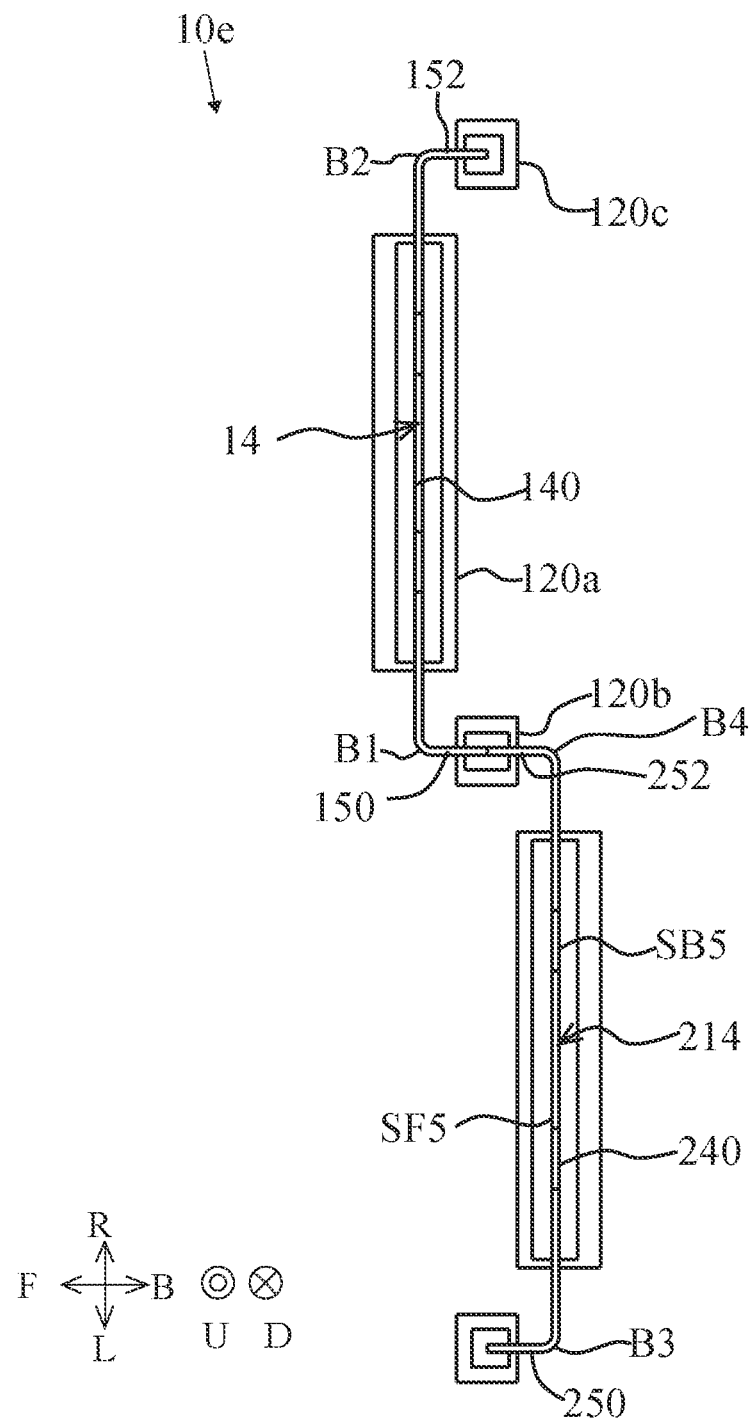
FIG. 28 is a top view of the first metal member 14 and a second metal member 214 according to a fifteenth modification.

Hereinafter, a module 10e according to a fifteenth modification will be described with reference to the drawings. FIG. 28 is a top view of a first metal member 14 and a second metal member 214 according to the fifteenth modification.

The module 10e is different from the module 10 in further including the second metal member 214. The second metal member 214 has the same structure as the first metal member 14. More specifically, the second metal member 214 includes a second plate-shaped portion 240, a second left support portion 250, and a second right support portion 252. A boundary between the second plate-shaped portion 240 and the second left support portion 250 is defined as a second left boundary B3. The second left boundary B3 is located on the left part of the second metal member 214. A boundary between the second plate-shaped portion 240 and the second right support portion 252 is defined as a second right boundary B4. The second right boundary B4 is located at the right part of the second metal member 214.

The second plate-shaped portion 240 is provided on the upper main surface SU2 of the substrate 12. The second plate-shaped portion 240 has a front main surface SF5 and a back main surface SB5 arranged in a front-back direction when viewed in the up-down direction. The second left support portion 250 is bent with respect to the second plate-shaped portion 240 at the second left boundary B3 so as to extend in the forward direction from the second plate-shaped portion 240 at the second left boundary B3. The second right support portion 252 is bent with respect to the second plate-shaped portion 240 at the second right boundary B4 so as to extend in the forward direction from the second plate-shaped portion 240 at the second right boundary B4. Thus, the lower end of the second plate-shaped portion 240, the lower end of the second left support portion 250, and the lower end of the second right support portion 252 are fixed to the substrate 12. The distance between the back end portion of the first left support portion 150 and the front end portion of the second right support portion 252 is shorter than the length of the first left support portion 150 in the front-back direction. In the present embodiment, the back end portion of the first left support portion 150 and the front end portion of the second right support portion 252 are in contact with each other. The back end portion of the first left support portion 150 and the front end portion of the second right support portion 252 are connected via solder (conductive bonding material). The first left support portion 150 and the second right support portion 252 are fixed to the mounting electrode left end portion 120b. Therefore, both the first metal member 14 and the second metal member 214 are stably connected to the ground potential.

According to the module 10e, if the electronic component is disposed behind the first plate-shaped portion 140 and the electronic component is disposed before the second plate-shaped portion 240, the distance between the two electronic components in the front-back direction can be shortened. For example, two electronic components can be disposed side by side in the left-right direction. At this time, the first left support portion 150 of the first metal member 14 and the second right support portion 252 of the second metal member 214 exist between the two electronic components. Therefore, the space between the two electronic components is shielded. As described above, according to the module 10e, it is possible to shield the two electronic components while reducing the distance in the front-back direction between the two electronic components.

According to the module 10e, a shield extending in the front-back direction can be formed by the first left support portion 150 and the second right support portion 252.

According to the module 10e, the gap formed between the first left support portion 150 and the second right support portion 252 can be reduced. More specifically, the first plate-shaped portion 140 is slightly inclined in the backward direction with respect to the up-down direction. The second plate-shaped portion 240 is slightly inclined in the forward direction with respect to the up-down direction. In this manner, the first plate-shaped portion 140 and the second plate-shaped portion 240 are inclined so as to approach each other. Therefore, the first left support portion 150 and the second right support portion 252 come close to each other. As a result, according to the module 10e, the gap formed between the first left support portion 150 and the second right support portion 252 is reduced. Accordingly, the shielding effect of the first metal member 14 and the second metal member 214 is enhanced.

According to the module 10e, it is possible to accurately manufacture a metal member having a combined shape of the first metal member 14 and the second metal member 214. More specifically, when a metal member having a combined shape of the first metal member 14 and the second metal member 214 is produced by processing one metal plate, four bent portions are generated in one metal plate. If the number of bent portions of the metal member increases, it is difficult to form the metal member with high accuracy. Therefore, in the module 10e, the first metal member 14 having two bent portions and the second metal member 214 having two bent portions are combined. Each of the first metal member 14 and the second metal member 214 can be manufactured with high accuracy. Therefore, a metal member having a shape in which the first metal member 14 and the second metal member 214 are combined can be manufactured with high accuracy.

According to the module 10e, metal members having various shapes can be produced by combining the first metal member 14 and the second metal member 214 having the same shape. It is not necessary to prepare a plurality of kinds of metal members having various shapes. Thus, metal members having various shapes can be manufactured at low cost.

According to the module 10e, the back end portion of the first left support portion 150 and the front end portion of the second right support portion 252 are connected via solder (conductive bonding material). Therefore, the potential of the first metal member 14 and the potential of the second metal member 214 are likely to be the ground potential.

(Sixteenth Modification)

Figure 29:
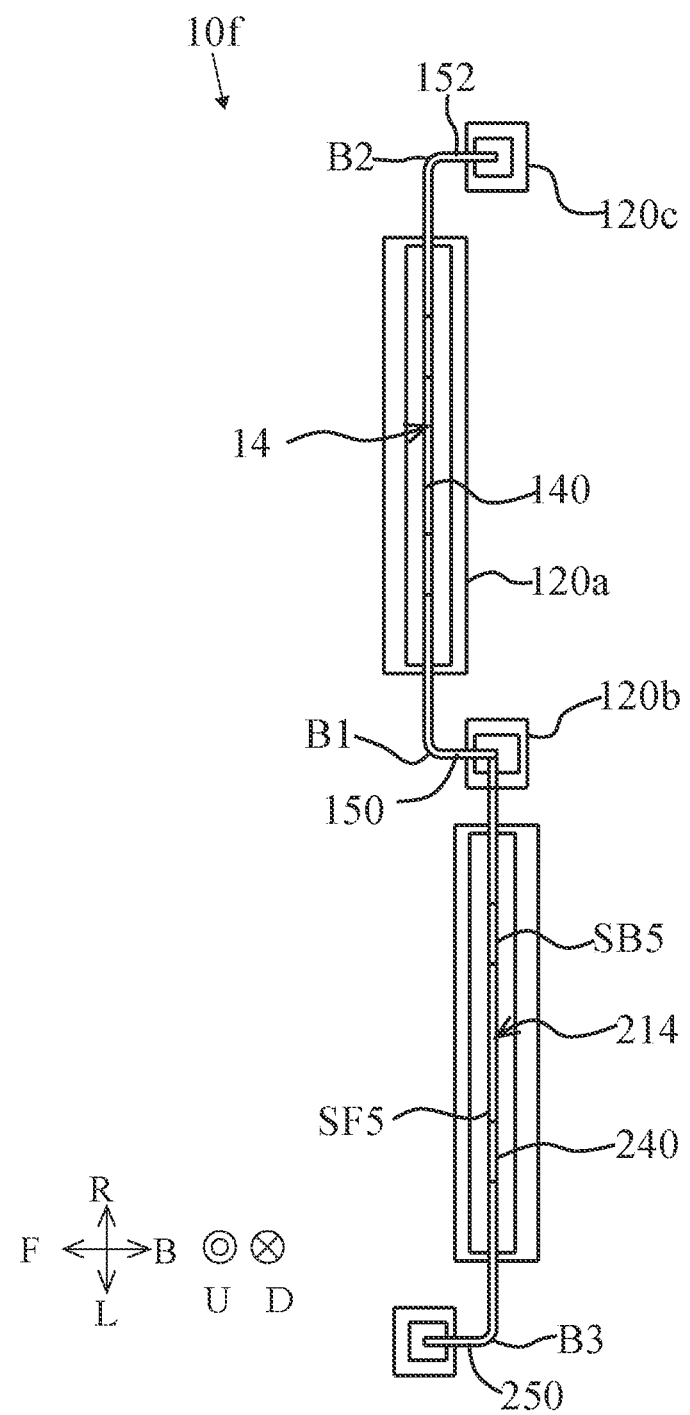
FIG. 29 is a top view of the first metal member 14 and the second metal member 214 according to a sixteenth modification.

Hereinafter, a module 10f according to a sixteenth modification will be described with reference to the drawings. FIG. 29 is a top view of a first metal member 14 and a second metal member 214 according to the sixteenth modification.

The module 10f is different from the module 10e in that the second metal member 214 does not include the second right support portion 252. Therefore, the distance between the back end portion of the first left support portion 150 and the right end portion of the second plate-shaped portion 240 is shorter than the length of the first left support portion 150 in the front-back direction. In the present embodiment, the back end portion of the first left support portion 150 and the right end portion of the second plate-shaped portion 240 are in contact with each other. The back end portion of the first left support portion 150 and the right end portion of the second plate-shaped portion 240 are connected via solder (conductive bonding material). The first left support portion 150 and the second plate-shaped portion 240 are fixed to the mounting electrode left end portion 120b. More specifically, the lower end of the second plate-shaped portion 240 and the lower end of the first left support portion 150 are fixed to the mounting electrode left end portion 120b of the substrate 12 by soldering.

According to the module 10f, the back end portion of the first left support portion 150 and the right end portion of the second plate-shaped portion 240 are connected via solder (conductive bonding material). Therefore, the potential of the first metal member 14 and the potential of the second metal member 214 are likely to be the ground potential.

(Seventeenth Modification)

Figure 30:
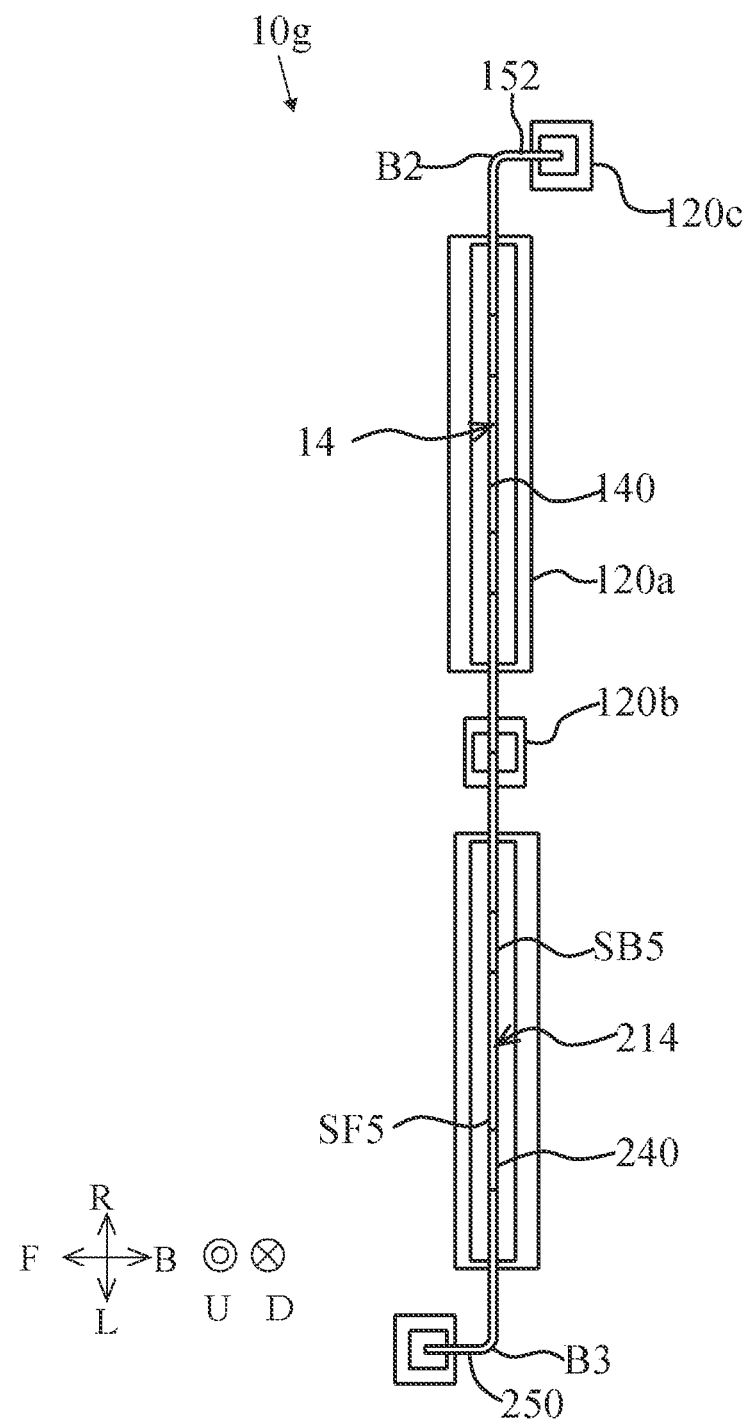
FIG. 30 is a top view of the first metal member 14 and the second metal member 214 according to a seventeenth modification.

Hereinafter, a module 10g according to a seventeenth modification will be described with reference to the drawings. FIG. 30 is a top view of a first metal member 14 and a second metal member 214 according to the seventeenth modification.

The module 10g is different from the module 10f in that the first metal member 14 does not include the first left support portion 150. Therefore, the distance between the left end portion of the first plate-shaped portion 140 and the right end portion of the second plate-shaped portion 240 is shorter than the length of the first right support portion 152 in the front-back direction. In the present embodiment, the left end portion of the first plate-shaped portion 140 and the right end portion of the second plate-shaped portion 240 are in contact with each other. The left end portion of the first plate-shaped portion 140 and the right end portion of the second plate-shaped portion 240 are connected via solder (conductive bonding material). The first plate-shaped portion 140 and the second plate-shaped portion 240 are fixed to the mounting electrode left end portion 120b.

According to the module 10g, the left end portion of the first plate-shaped portion 140 and the right end portion of the second plate-shaped portion 240 are connected via solder (conductive bonding material). Therefore, the potential of the first metal member 14 and the potential of the second metal member 214 are likely to be the ground potential.

OTHER EMBODIMENTS

The module and the first metal member according to the present disclosure are not limited to the modules 10 and 10a to 10g and the first metal members 14 and 14a to 14k according to the above embodiments, and can be modified within the scope of the gist thereof.

The structures of the modules 10 and 10a to 10g may be arbitrarily combined, or the structures of the first metal members 14 and 14a to 14k may be arbitrarily combined.

The substrate 12 may have a shape other than a rectangular shape when viewed in the up-down direction.

The number of electronic components 16a to 16e is not limited to 5.

The module 10 may not include the shield 20.

The shield 20 may cover at least the upper surface SU1 of the sealing resin layer 18. Therefore, the shield 20 may not cover a part or all of the left surface SL1, the right surface SR1, the front surface SF1, and the back surface SB1 of the sealing resin layer 18, for example.

Incidentally, the outer edge of the substrate 12 may not overlap so as to coincide with the outer edge of the sealing resin layer 18 when viewed in the up-down direction. That is, the front surface SF1 of the sealing resin layer 18 may be located before the front surface SF2 of the substrate 12. The back surface SB1 of the sealing resin layer 18 may be located behind the back surface SB2 of the substrate 12. The left surface SL1 of the sealing resin layer 18 may be located to the left of the left surface SL2 of the substrate 12. The right surface SR1 of the sealing resin layer 18 may be located to the right of the right surface SR2 of the substrate 12.

The electronic components 16a to 16e do not protrude in the left direction or the right direction from the first metal member 14 when viewed in the front-back direction. However, a part of the electronic components 16a to 16e may protrude in the left direction or the right direction from the first metal member 14 when viewed in the front-back direction.

The first metal member 14 may include either the first left support portion 150 or the first right support portion 152.

In the first metal member 14, the first left support portion 150 may be located in front of the first plate-shaped portion 140. In the first metal member 14, the first left support portion 150 may extend in the forward direction from the first plate-shaped portion 140 at the first left boundary B1. In the first metal member 14, the first right support portion 152 may be located in front of the first plate-shaped portion 140. The first right support portion 152 may extend in the forward direction from the first plate-shaped portion 140 at the first right boundary B2.

In the second metal member 214, the second left support portion 250 may be located in front of the second plate-shaped portion 240. In the second metal member 214, the second left support portion 250 may extend in the forward direction from the second plate-shaped portion 240 at the second left boundary B3. The second left support portion 250 may be located behind the second plate-shaped portion 240. In the second metal member 214, the second left support portion 250 may extend in the backward direction from the second plate-shaped portion 240 at the second left boundary B3. In the second metal member 214, the second right support portion 252 may be located in front of the second plate-shaped portion 240. The second right support portion 252 may extend in the forward direction from the second plate-shaped portion 240 at the second right boundary B4. In the second metal member 214, the second right support portion 252 may be located behind the second plate-shaped portion 240. The second right support portion 252 may extend in the backward direction from the second plate-shaped portion 240 at the second right boundary B4.

Note that, in the first metal member 14, the first plate-shaped portion lower notch may not be provided, or one or more first plate-shaped portion lower notches may be provided.

In the first metal member 14k, the first left support portion 150 may extend in the backward direction from the first plate-shaped portion 140 at the first left boundary B1. The first left support portion 150 may be provided with one or more first left support portion lower notches.

The angle formed by the first plate-shaped portion 140 and the first left support portion 150 may be different from the angle formed by the first plate-shaped portion 140 and the first right support portion 152.

The first left support portion 150 and the first right support portion 152 are not exposed from the sealing resin layer 18. However, the first left support portion 150 and the first right support portion 152 may be exposed from the sealing resin layer 18. However, when the first left support portion 150 is exposed from the sealing resin layer 18, the first left support portion 150 may not be fixed to the mounting electrode 12a by the solder 122. When the first right support portion 152 is exposed from the sealing resin layer 18, the first right support portion 152 may not be fixed to the mounting electrode 12a by the solder 122.

The first left support portion 150 may be bent with respect to the first plate-shaped portion 140 at the first left boundary B1 so as to be located in front of the first plate-shaped portion 140. The first right support portion 152 may be bent with respect to the first plate-shaped portion 140 at the first right boundary B2 so as to be located in front of the first plate-shaped portion 140.

10, 10a to 10g module
12 substrate
12a mounting electrode
14, 14a to 14k first metal member
16a to 16g electronic component
18 sealing resin layer
20 shield
120a mounting electrode main portion
120b mounting electrode left end portion
120c mounting electrode right end portion
122, 122a to 122e solder
140 first plate-shaped portion
142a to 142d first plate-shaped portion upper notch
144a to 144e first plate-shaped portion lower notch
146 first left lower notch
146U, 148U, 144aU upper end
148 first right lower notch
149 top surface portion
150 first left support portion
151 curved portion
152 first right support portion
154a to 154d first left support portion lower notch
156a to 156d first left support portion upper notch
214 second metal member
240 second plate-shaped portion
250 second left support portion
252 second right support portion
B1 first left boundary
B2 first right boundary
B3 second left boundary
B4 second right boundary
G ground conductor layer
va to ve interlayer connection conductor

The invention claimed is:

1. A module comprising:
   a substrate having an upper main surface and a lower main surface arranged in an up-down direction;
   a first metal member including a first plate-shaped portion provided on the upper main surface of the substrate, the first plate-shaped portion having a front main surface and a back main surface arranged in a front-back direction when viewed in the up-down direction;
   a first electronic component mounted on the upper main surface of the substrate and disposed in front of the first metal member;
   a second electronic component mounted on the upper main surface of the substrate and disposed behind the first metal member; and
   a sealing resin layer provided on the upper main surface of the substrate and covering the first metal member, the first electronic component, and the second electronic component,
   wherein
   the first metal member further includes a first left support portion,
   a boundary between the first plate-shaped portion and the first left support portion is defined as a first left boundary,
   the first left boundary is located on a left part of the first metal member,
   the first left support portion bends with respect to the first plate-shaped portion at the first left boundary so as to be located in front of or behind the first plate-shaped portion,
   a lower end of the first plate-shaped portion and a lower end of the first left support portion are fixed to the substrate, and
   a first left lower notch extending in an upward direction from the lower end of the first plate-shaped portion and the lower end of the first left support portion is provided such that a lower end of the first left boundary is located above the lower end of the first plate-shaped portion and the lower end of the first left support portion.

2. The module according to claim 1, wherein the first left support portion extends in a forward direction or a backward direction from the first plate-shaped portion at the first left boundary.

3. The module according to claim 1, wherein
   when viewed in the front-back direction, a line connecting the lower end of the first plate-shaped portion in a left-right direction is defined as a first plate-shaped portion lower side,
   the first plate-shaped portion is provided with one or more first plate-shaped portion lower notches extending in an upward direction from the first plate-shaped portion lower side, and
   a position of an upper end of the first left lower notch in the up-down direction is a same as a position of an upper end of each of the first plate-shaped portion lower notches in the up-down direction.

4. The module according to claim 1, wherein
   when viewed in the front-back direction, a line connecting the lower end of the first plate-shaped portion in a left-right direction is defined as a first plate-shaped portion lower side,
   the first plate-shaped portion is provided with one or more first plate-shaped portion lower notches extending in an upward direction from the first plate-shaped portion lower side, and an upper end of the first left lower notch is located below an upper end of each of the first plate-shaped portion lower notches.

5. The module according to claim 1, wherein
the first left support portion extends in a forward direction or a backward direction from a left end of the first plate-shaped portion,
when viewed in a left-right direction, a side connecting the lower end of the first left support portion in the front-back direction is defined as a first left support portion lower side, and
the first left support portion is provided with one or more first left support portion lower notches extending in an upward direction from the first left support portion lower side.

6. The module according to claim 1, further comprising a second metal member including a second plate-shaped portion provided on the upper main surface of the substrate, the second plate-shaped portion including a front main surface and a back main surface arranged in the front-back direction when viewed in the up-down direction,
wherein
the first left support portion extends in a backward direction from the first plate-shaped portion at the first left boundary,
the second metal member further includes a second right support portion,
a boundary between the second plate-shaped portion and the second right support portion is defined as a second right boundary,
the second right boundary is located at a right part of the second metal member,
the second right support portion bends with respect to the second plate-shaped portion at the second right boundary so as to extend in a forward direction from the second plate-shaped portion at the second right boundary,
a lower end of the second plate-shaped portion and a lower end of the second right support portion are fixed to the substrate, and
a distance between a back end portion of the first left support portion and a front end portion of the second right support portion is shorter than a length of the first left support portion in the front-back direction.

7. The module according to claim 1, further comprising a second metal member including a second plate-shaped portion provided on the upper main surface of the substrate, the second plate-shaped portion including a front main surface and a back main surface arranged in the front-back direction when viewed in the up-down direction,
wherein
the first left support portion extends in a backward direction from the first plate-shaped portion at the first left boundary,
the second metal member further includes a second left support portion,
a boundary between the second plate-shaped portion and the second left support portion is defined as a second left boundary,
the second left boundary is located on a left part of the second metal member,
the second left support portion bends with respect to the second plate-shaped portion at the second left boundary so as to extend in a forward direction or a backward direction from the second plate-shaped portion at the second left boundary,
a lower end of the second plate-shaped portion and a lower end of the second left support portion are fixed to the substrate, and
a distance between a back end portion of the first left support portion and a right end portion of the second plate-shaped portion is shorter than a length of the first left support portion in the front-back direction.

8. The module according to claim 1, wherein
the first metal member further includes a first right support portion,
a boundary between the first plate-shaped portion and the first right support portion is defined as a first right boundary,
the first right boundary is located at a right part of the first metal member,
the first right support portion bends with respect to the first plate-shaped portion at the first right boundary so as to be located in front of or behind the first plate-shaped portion,
a lower end of the first plate-shaped portion and a lower end of the first right support portion are fixed to the substrate, and
a first right lower notch extending in an upward direction from the lower end of the first plate-shaped portion and a lower end of the first right support portion is provided such that a lower end of the first right boundary is located above the lower end of the first plate-shaped portion and the lower end of the first right support portion.

9. The module according to claim 8, further comprising a second metal member including a second plate-shaped portion provided on the upper main surface of the substrate, the second plate-shaped portion including a front main surface and a back main surface arranged in the front-back direction when viewed in the up-down direction,
wherein
the first right support portion extends in a backward direction from the first plate-shaped portion at the first right boundary,
the second metal member further includes a second left support portion,
a boundary between the second plate-shaped portion and the second left support portion is defined as a second left boundary,
the second left boundary is located on a left part of the second metal member,
the second left support portion bends with respect to the second plate-shaped portion at the second left boundary so as to extend in a forward direction or a backward direction from the second plate-shaped portion at the second left boundary,
a lower end of the second plate-shaped portion and a lower end of the second left support portion are fixed to the substrate, and
a distance between a left end portion of the first plate-shaped portion and a right end portion of the second plate-shaped portion is shorter than a length of the first right support portion in the front-back direction.

10. The module according to claim 9, wherein
the substrate includes a mounting electrode left end portion, and
the lower end of the second plate-shaped portion and the lower end of the second left support portion are fixed to the mounting electrode left end portion of the substrate by solder.

11. The module according to claim 1, further comprising a second metal member including a second plate-shaped portion provided on the upper main surface of the substrate, the second plate-shaped portion including a front main surface and a back main surface arranged in the front-back direction when viewed in the up-down direction,
wherein
the first left support portion extends in a backward direction from the first plate-shaped portion at the first left boundary,
the second metal member further includes a second right support portion,
a boundary between the second plate-shaped portion and the second right support portion is defined as a second right boundary,
the second right boundary is located at a right part of the second metal member,
the second right support portion bends with respect to the second plate-shaped portion at the second right boundary so as to extend in a forward direction from the second plate-shaped portion at the second right boundary,
a lower end of the second plate-shaped portion and a lower end of the second right support portion are fixed to the substrate, and
a back end portion of the first left support portion and a front end portion of the second right support portion are connected via a conductive bonding material.

12. The module according to claim 1, further comprising a second metal member including a second plate-shaped portion provided on the upper main surface of the substrate, the second plate-shaped portion including a front main surface and a back main surface arranged in the front-back direction when viewed in the up-down direction,
wherein
the first left support portion extends in a backward direction from the first plate-shaped portion at the first left boundary,
the second metal member further includes a second left support portion,
a boundary between the second plate-shaped portion and the second left support portion is defined as a second left boundary,
the second left boundary is located on a left part of the second metal member,
the second left support portion bends with respect to the second plate-shaped portion at the second left boundary so as to extend in a forward direction or a backward direction from the second plate-shaped portion at the second left boundary,
a lower end of the second plate-shaped portion and a lower end of the second left support portion are fixed to the substrate, and
a back end portion of the first left support portion and a right end portion of the second plate-shaped portion are connected via a conductive bonding material.

13. The module according to claim 8, further comprising a second metal member including a second plate-shaped portion provided on the upper main surface of the substrate, the second plate-shaped portion including a front main surface and a back main surface arranged in the front-back direction when viewed in the up-down direction,
wherein
the first right support portion extends in a backward direction from the first plate-shaped portion at the first right boundary,
the second metal member further includes a second left support portion,
a boundary between the second plate-shaped portion and the second left support portion is defined as a second left boundary,
the second left boundary is located on a left part of the second metal member,
the second left support portion bends with respect to the second plate-shaped portion at the second left boundary so as to extend in a forward direction or a backward direction from the second plate-shaped portion at the second left boundary,
a lower end of the second plate-shaped portion and a lower end of the second left support portion are fixed to the substrate, and
a left end portion of the first plate-shaped portion and a right end portion of the second plate-shaped portion are connected via a conductive bonding material.

14. The module according to claim 1, wherein an upper end of the first plate-shaped portion is exposed to an upper surface of the sealing resin layer.

15. The module according to claim 1, further comprising a shield electrically connected to the first metal member and covering an upper surface of the sealing resin layer.

16. The module according to claim 2, wherein
when viewed in the front-back direction, a line connecting the lower end of the first plate-shaped portion in a left-right direction is defined as a first plate-shaped portion lower side,
the first plate-shaped portion is provided with one or more first plate-shaped portion lower notches extending in an upward direction from the first plate-shaped portion lower side, and
a position of an upper end of the first left lower notch in the up-down direction is a same as a position of an upper end of each of the first plate-shaped portion lower notches in the up-down direction.

17. The module according to claim 2, wherein
when viewed in the front-back direction, a line connecting the lower end of the first plate-shaped portion in a left-right direction is defined as a first plate-shaped portion lower side,
the first plate-shaped portion is provided with one or more first plate-shaped portion lower notches extending in an upward direction from the first plate-shaped portion lower side, and
an upper end of the first left lower notch is located below an upper end of each of the first plate-shaped portion lower notches.

18. The module according to claim 2, wherein
the first left support portion extends in a forward direction or a backward direction from a left end of the first plate-shaped portion,
when viewed in a left-right direction, a side connecting the lower end of the first left support portion in the front-back direction is defined as a first left support portion lower side, and
the first left support portion is provided with one or more first left support portion lower notches extending in an upward direction from the first left support portion lower side.

19. The module according to claim 3, wherein
the first left support portion extends in a forward direction or a backward direction from a left end of the first plate-shaped portion,
when viewed in a left-right direction, a side connecting the lower end of the first left support portion in the front-back direction is defined as a first left support portion lower side, and the first left support portion is provided with one or more first left support portion lower notches extending in an upward direction from the first left support portion lower side.

20. The module according to claim 4, wherein the first left support portion extends in a forward direction or a backward direction from a left end of the first plate-shaped portion, when viewed in a left-right direction, a side connecting the lower end of the first left support portion in the front-back direction is defined as a first left support portion lower side, and the first left support portion is provided with one or more first left support portion lower notches extending in an upward direction from the first left support portion lower side.

* * * * *